US012690259B2

(12) United States Patent
Fulford et al.

(10) Patent No.: US 12,690,259 B2
(45) Date of Patent: Jul. 21, 2026

(54) DEVICE AND METHOD OF FORMING 3D U-SHAPED NANOSHEET CFET

(71) Applicant: Tokyo Electron Limited, Tokyo (JP)

(72) Inventors: H. Jim Fulford, Marianna, FL (US); Mark I. Gardner, Cedar Creek, TX (US); Partha Mukhopadhyay, Oviedo, FL (US)

(73) Assignee: Tokyo Electron Limited, Tokyo (JP)

( * ) Notice: Subject to any disclaimer, the term of this patent is extended or adjusted under 35 U.S.C. 154(b) by 635 days.

(21) Appl. No.: 18/159,462

(22) Filed: Jan. 25, 2023

(65) Prior Publication Data

US 2024/0249978 A1      Jul. 25, 2024

(51) Int. Cl.
| | |
|---|---|
| *H10D 84/03* | (2025.01) |
| *H10D 30/01* | (2025.01) |
| *H10D 30/43* | (2025.01) |
| *H10D 84/82* | (2025.01) |
| *H10D 84/83* | (2025.01) |
| *H10D 88/00* | (2026.01) |

(52) U.S. Cl.
CPC ........... *H10D 84/038* (2025.01); *H10D 84/83* (2025.01); *H10D 88/01* (2025.01)

(58) Field of Classification Search
CPC .. H10D 30/014; H10D 30/43; H10D 30/6757; H10D 30/797; H10D 84/013; H10D 62/154; H10D 62/155; H10D 62/158; H10D 62/159; H10D 84/017; H10D 30/6735; H10D 88/00; H10D 84/0167; H10D 84/0128; H10D 84/038; H10D 84/83
See application file for complete search history.

(56) References Cited

U.S. PATENT DOCUMENTS

2021/0104522 A1* 4/2021 Gardner ................. H10D 62/80
2022/0320347 A1* 10/2022 Murray ............. H10D 30/6755

* cited by examiner

*Primary Examiner* — Sonya McCall-Shepard
(74) *Attorney, Agent, or Firm* — Oblon, McClelland, Maier & Neustadt, L.L.P.

(57) ABSTRACT

A semiconductor device includes a substrate having a working surface and a transistor formed in the substrate. The transistor includes a complex channel structure including a main portion extending in a main direction along the working surface, and tail portions each connected to a respective end of the main portion and extending along the working surface in a different direction from the main direction, a distal end of each tail portion including a source-drain (S-D) end such that the S-D ends are offset from the main portion of the complex channel structure. A gate all around (GAA) structure formed around only the main portion of the complex channel structure between the tail portions, and S-D contacts formed on respective S-D ends of the complex channel structure such that the S-D contacts are offset from the GAA structure.

10 Claims, 43 Drawing Sheets

| | |
|---|---|
| 71 | Silicon |
| 73 | SiGe65 |
| 75 | SiGe |
| 77 | Dielectric-1 |
| 79 | Dielectric-2 |
| 81 | Dielectric-3 |
| 83 | Photoresist |
| 85 | Dielectric-4 |
| 87 | Dielectric-5 |
| 89 | Dielectric-6 |
| 91 | n-Silicon |
| 93 | Metal-1 |
| 95 | Silicide |
| 97 | High-K 1 |
| 99 | Metal-2 |

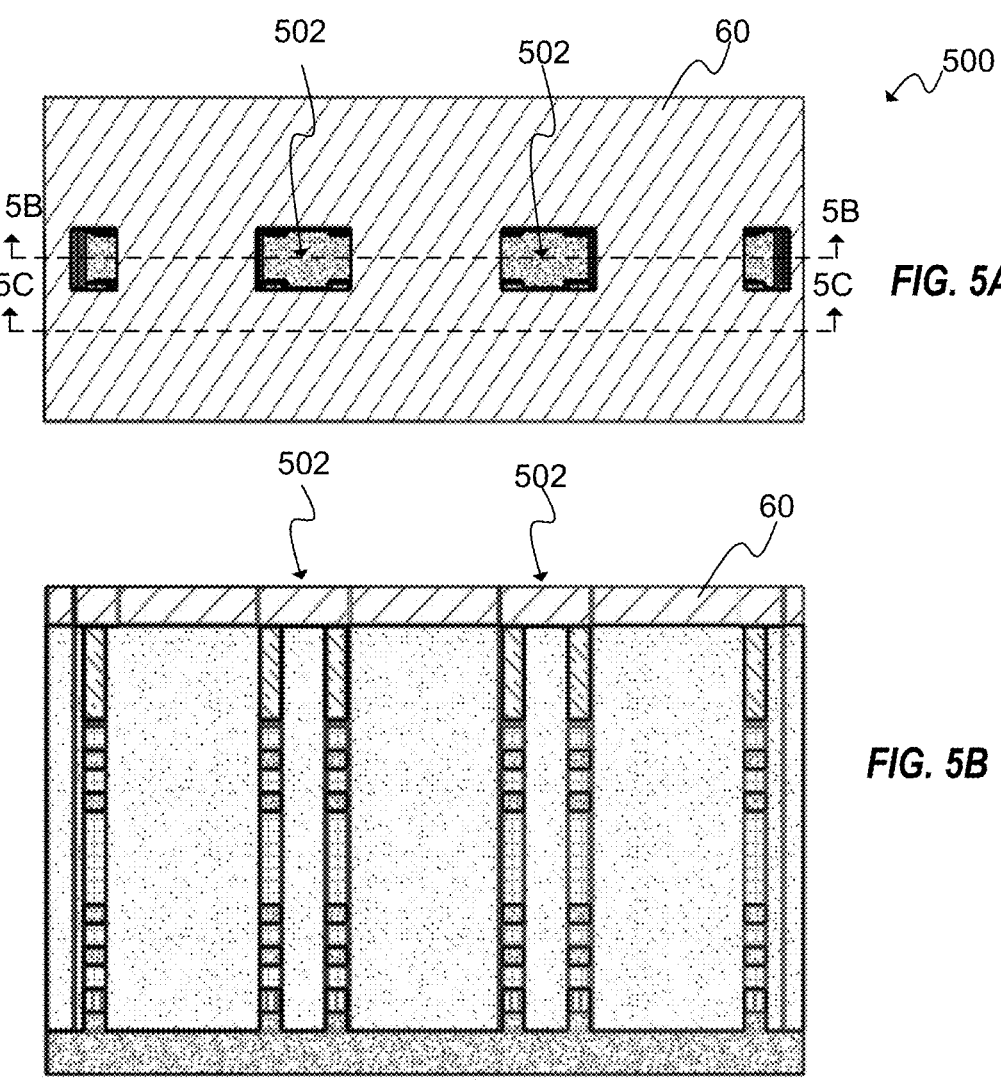
*FIG. 5A*
*FIG. 5B*
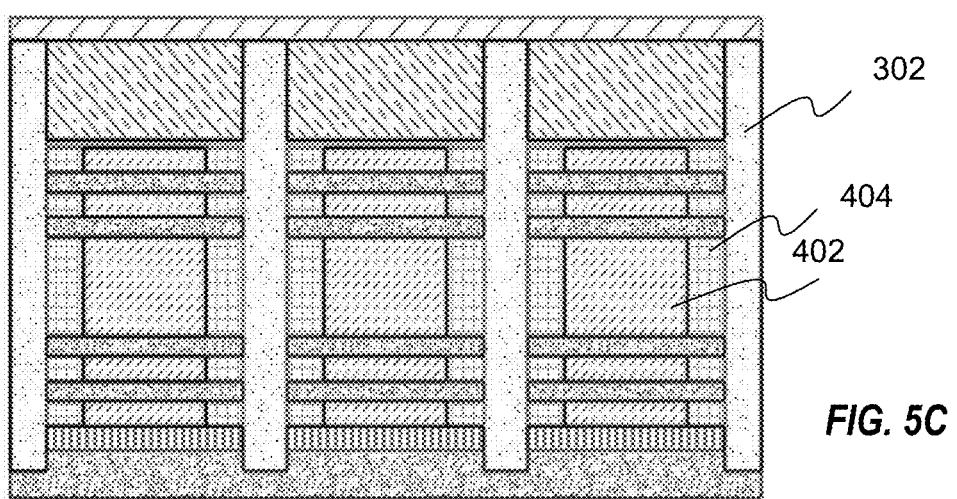
*FIG. 5C*

602
600
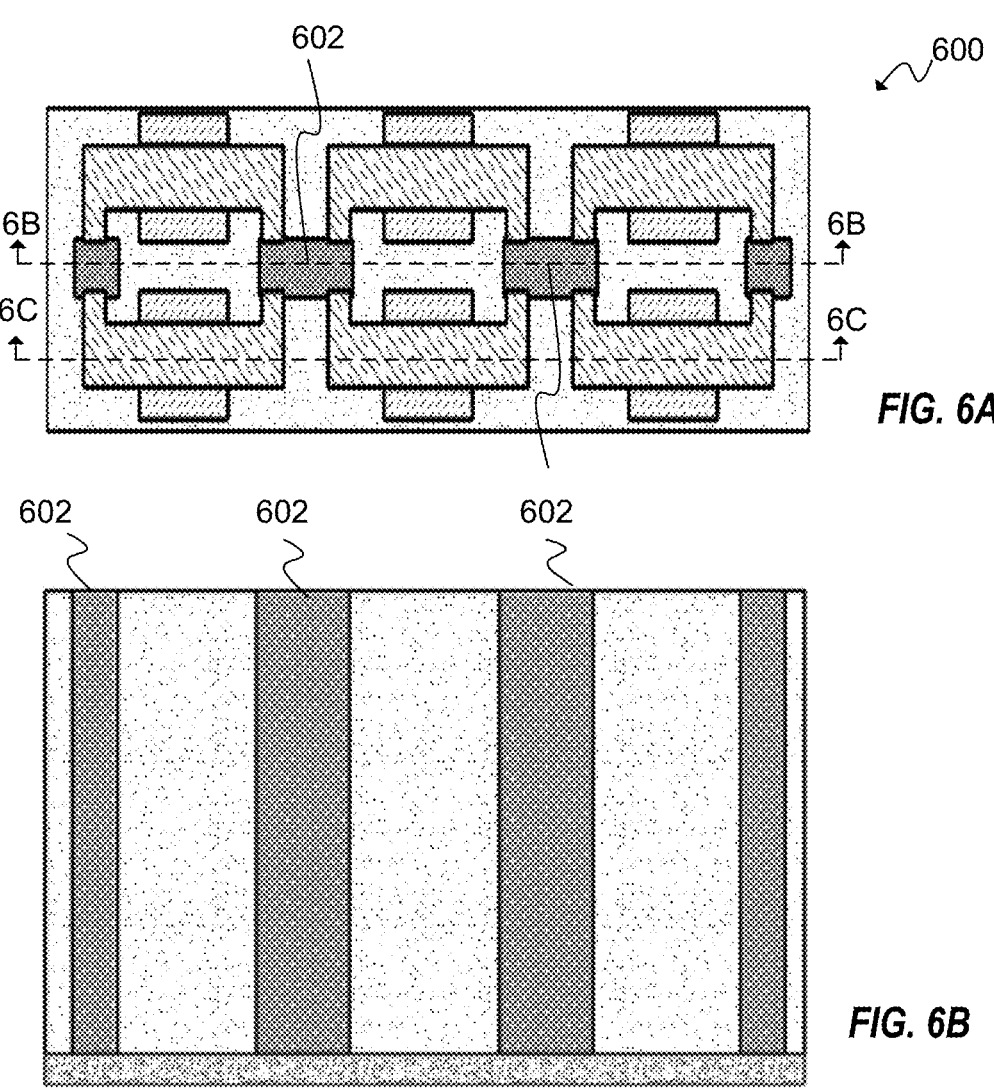
*FIG. 6A*
602          602          602
*FIG. 6B*
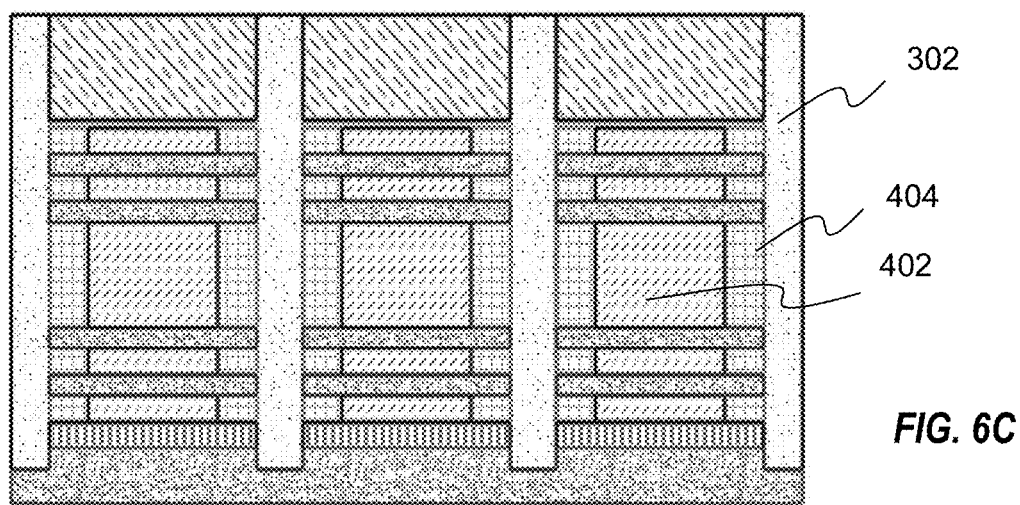
302
404
402
*FIG. 6C*

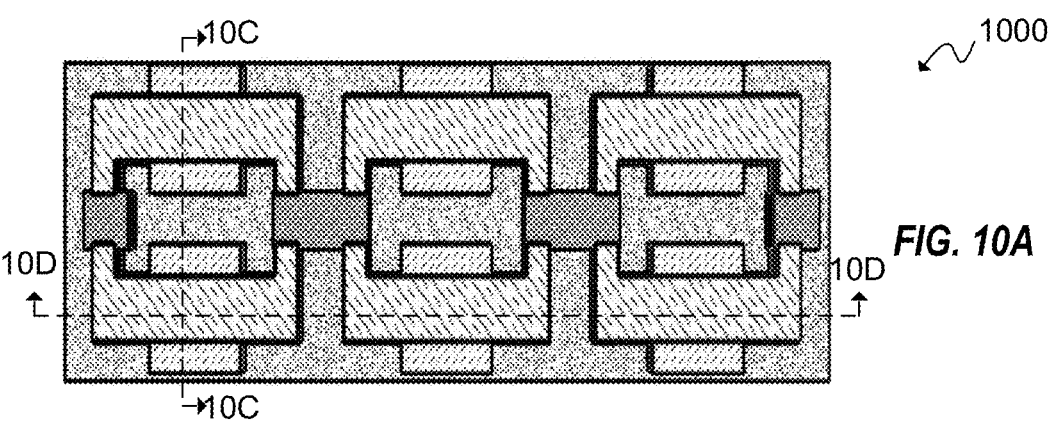
*FIG. 10A*
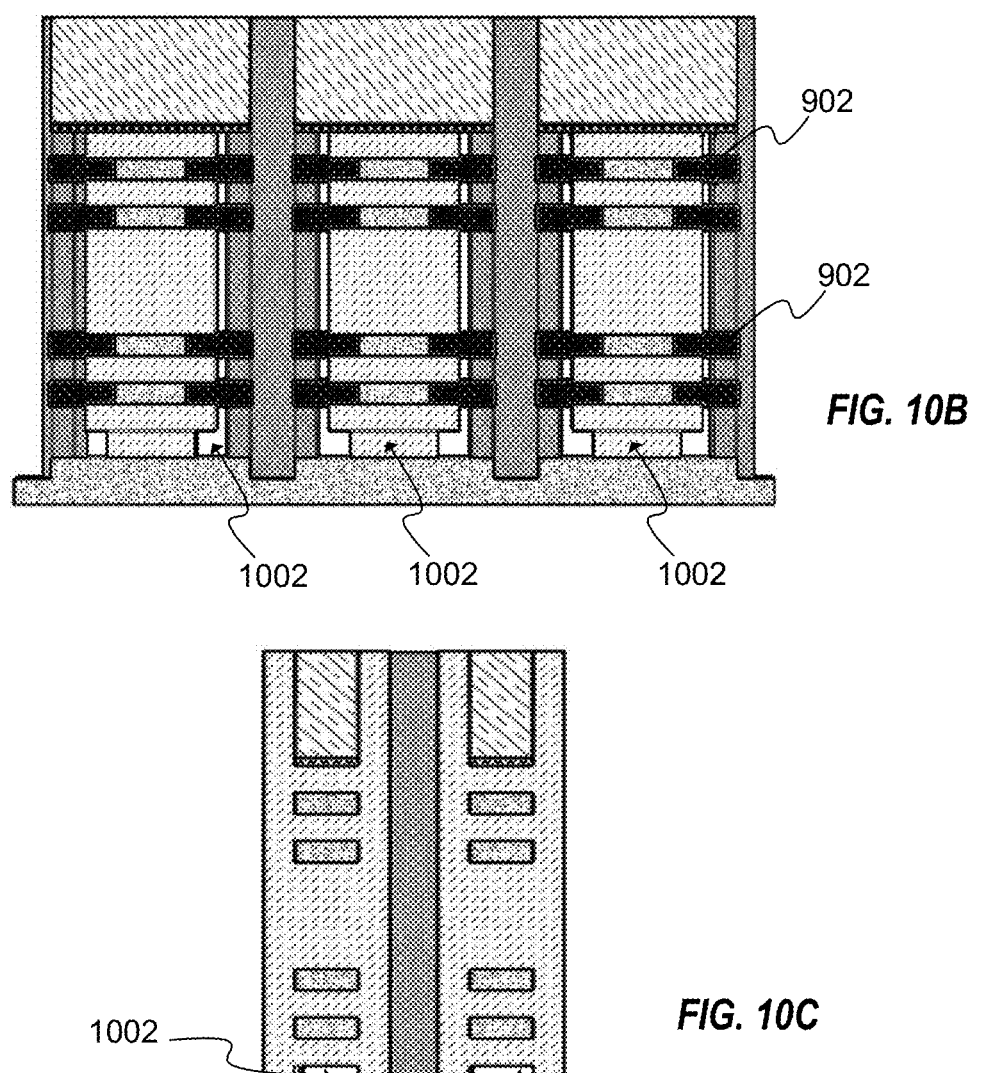
*FIG. 10B*
*FIG. 10C*

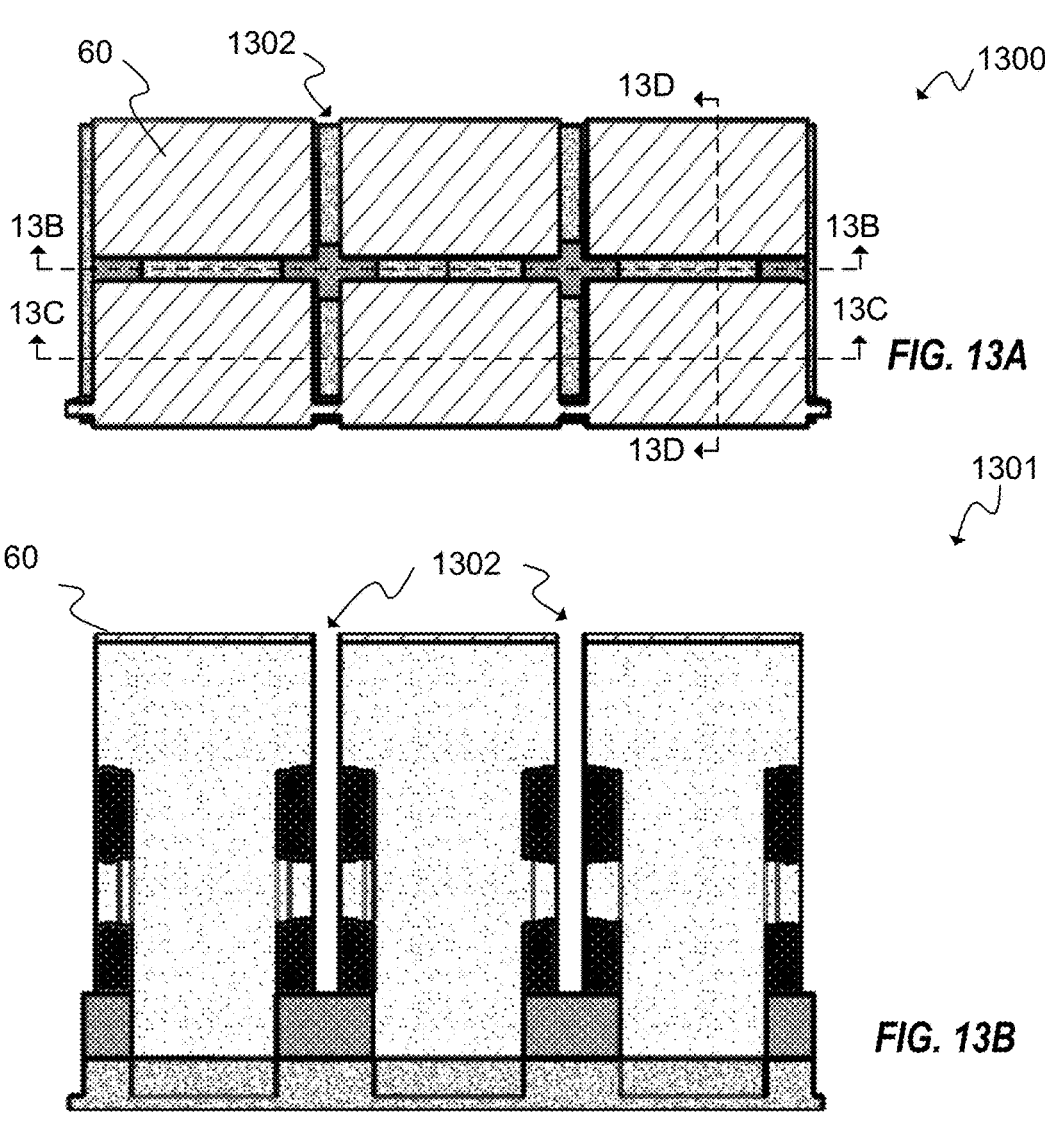
FIG. 13A
FIG. 13B
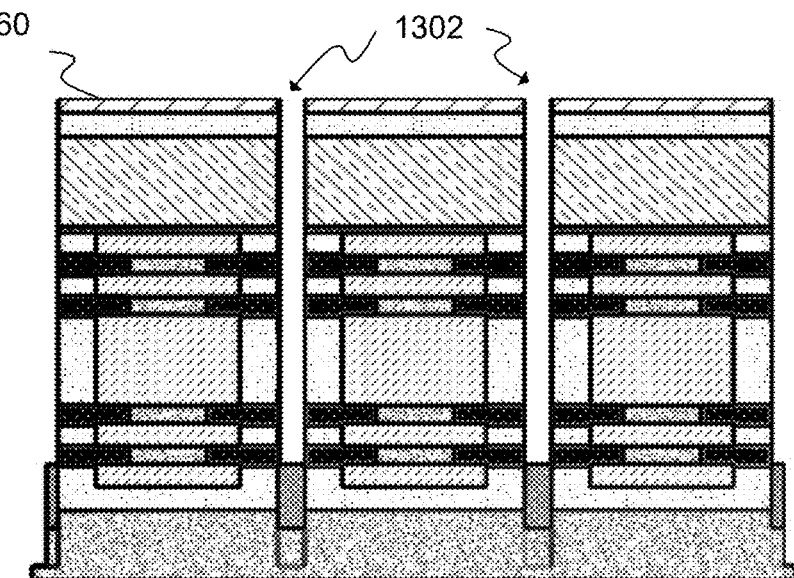
FIG. 13C

1700

1602          1602

17D          17D 17B          17B 17C          17C

1702

1702

1702

402

1700

1702

1702

1702

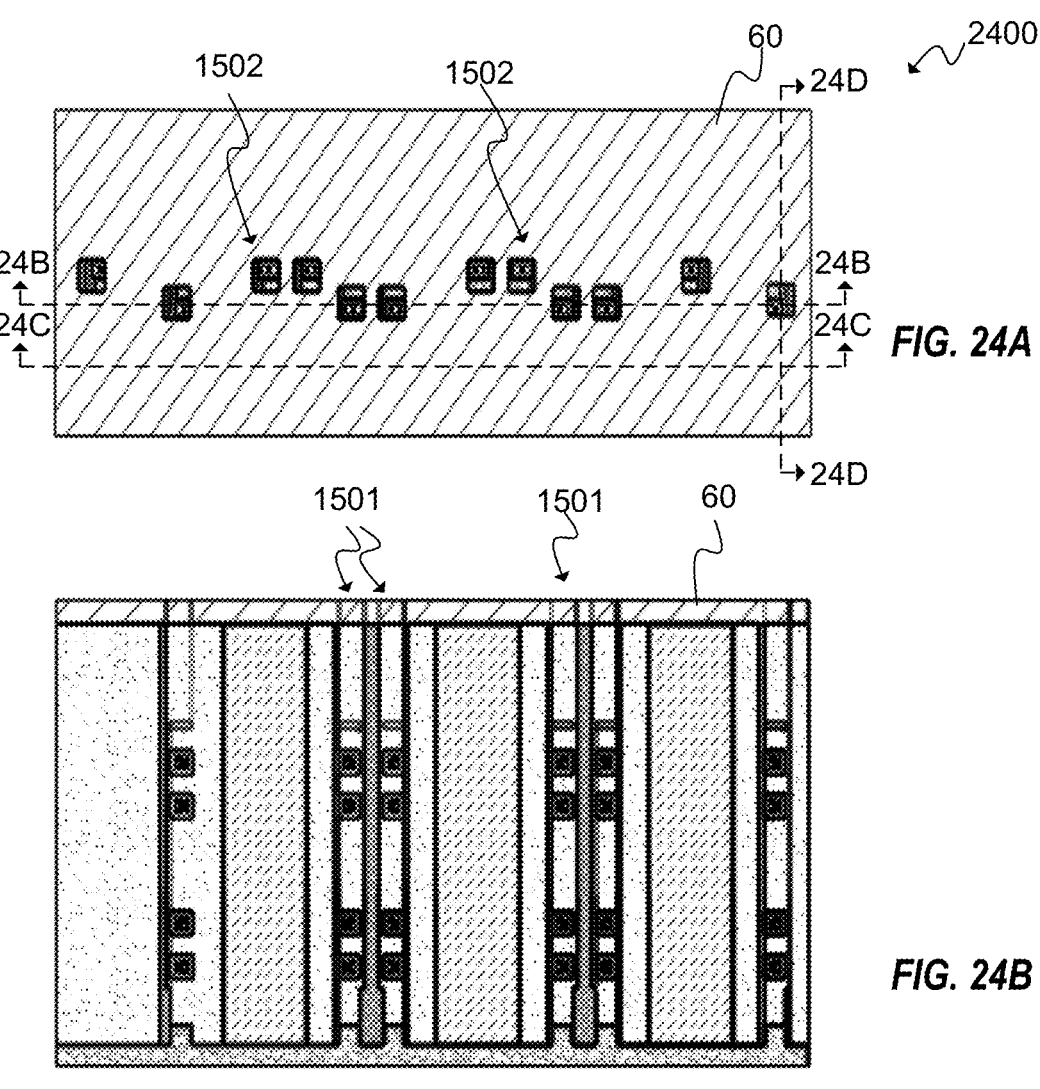
*FIG. 24A*
*FIG. 24B*
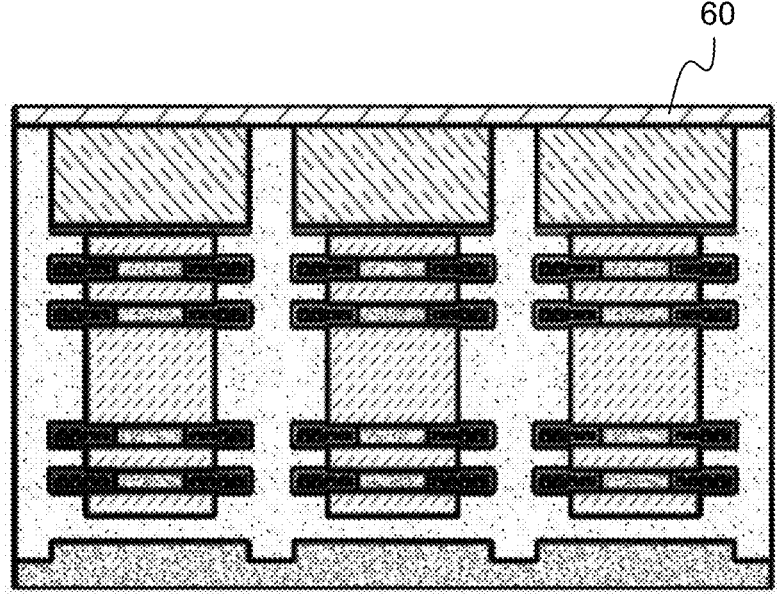
*FIG. 24C*

2700

44

27B    27B

26B 44       44

2702

2702

DEVICE AND METHOD OF FORMING 3D U-SHAPED NANOSHEET CFET

FIELD OF THE INVENTION

The present disclosure generally relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

SUMMARY

The present disclosure is directed towards a semiconductor device and a method to fabricate a semiconductor device.

An aspect (1) relates to a method of manufacturing a semiconductor device including providing a substrate having a working surface and a stack of layers including at least one semiconductor layer for forming a channel structure of a transistor. The stack of layers is patterned such that the at least one semiconductor layer has a complex channel structure including a main portion extending in a main direction along the working surface, and tail portions each connected to a respective end of the main portion and extending along the working surface in a different direction from the main direction. A distal end of each tail portion includes a source-drain (S-D) end such that the S-D ends are offset from the main portion of the complex channel structure, and S-D contacts are formed on respective S-D ends of the complex channel structure such that the S-D contacts are offset from the main portion of the complex channel structure. A gate all around (GAA) structure is formed around only the main portion of the complex channel structure between the tail portions such that the S-D contacts are offset from the GAA structure.

An aspect (2) includes the method of aspect (1), wherein the patterning includes forming each tail portion extending along a direction substantially perpendicular to the main direction.

An aspect (3) includes the method of aspect (2), wherein the patterning includes: forming a first S-D region including a first one of the tail portions connected to a first end of the main portion and terminating in a first one of the S-D ends; and forming a second S-D region including a second one of the tail portions connected to a second end of the main portion and terminating in a second one of the S-D ends.

An aspect (4) includes the method of aspect (1), wherein the forming S-D contacts includes epitaxially growing doped silicon contacts from each of the S-D ends.

An aspect (5) includes the method of aspect (1), wherein the forming S-D contacts includes depositing metal in contact with each respective S-D end, and annealing to for silicide contacts from each of the S-D ends.

An aspect (6) includes the method of aspect (1), wherein the forming a GAA structure includes depositing a high-k layer around the main portion, and depositing a gate metal around the high-k layer.

An aspect (7) includes the method of aspect (1), wherein the patterning includes forming the complex channel structure as a U-shaped channel structure in a plane parallel to the working surface of the substrate with ends of the U-shaped channel structure providing the first and second S-D ends.

An aspect (8) includes the method of aspect (7), including forming a plurality of transistors each having the U-shaped channel structure and arranged adjacent to each other such that the S-D ends of a first transistor face the S-D ends of a second transistor.

An aspect (9) includes the method of aspect (7), including forming a plurality of transistors each having the U-shaped channel structure and arranged adjacent to each other such that the S-D ends of a first transistor are staggered with respect to the S-D ends of a second transistor.

An aspect (10) includes the method of aspect (7), including forming a stack of transistors each having the U-shaped channel structure and arranged over each other such that the U-shaped channel structure of a lower transistor is vertically aligned with the U-shaped channel structure of an upper transistor.

Another aspect (11) relates to a semiconductor device including a substrate including a working surface; and a transistor formed in the substrate. The transistor includes a complex channel structure including a main portion extending in a main direction along the working surface, and tail portions each connected to a respective end of the main portion and extending along the working surface in a different direction from the main direction, a distal end of each tail portion including a source-drain (S-D) end such that the S-D ends are offset from the main portion of the complex channel structure. A gate all around (GAA) structure formed around only the main portion of the complex channel structure between the tail portions, and S-D contacts formed on respective S-D ends of the complex channel structure such that the S-D contacts are offset from the GAA structure.

An aspect (12) includes the device of aspect (11), wherein each tail portion extends along a direction substantially perpendicular to the main direction.

An aspect (13) includes the device of aspect (12), wherein the transistor includes: a first S-D region including a first one of the tail portions connected to a first end of the main portion and terminating in a first one of the S-D ends; and a second S-D region including a second one of the tail portions connected to a second end of the main portion and terminating in a second one of the S-D ends.

An aspect (14) includes the device of aspect (11), wherein the GAA structure includes a high-k layer formed around the main portion and a gate metal formed around the high-k layer.

An aspect (15) includes the device of aspect (11), wherein the S-D contacts include epitaxial doped silicon.

An aspect (16) includes the device of aspect (11), wherein the S-D contacts include metal and silicide.

An aspect (17) includes the device of aspect (11), wherein the complex channel structure is a U-shaped channel structure in a plane parallel to the working surface of the substrate and ends of the U-shaped channel structure provide the first and second S-D ends.

An aspect (18) includes the device of aspect (17), including a plurality of the transistors each having the U-shaped channel structure and arranged adjacent to each other such that the S-D ends of a first transistor face the S-D ends of a second transistor.

An aspect (19) includes the device of aspect (17), including a plurality of the transistors each having the U-shaped channel structure and arranged adjacent to each other such that the S-D ends of a first transistor are staggered with respect to the S-D ends of a second transistor.

An aspect (20) includes the device of aspect (17), including a stack of transistors each having the U-shaped channel structure and arranged over each other such that the U-shaped channel structure of a lower transistor is vertically aligned with the U-shaped channel structure of an upper transistor.

BRIEF DESCRIPTION OF THE DRAWINGS

Various embodiments of this disclosure that are proposed as examples will be described in detail with reference to the following figures, wherein like numerals reference like elements, and wherein:

FIG. 6A is a top plane view of an intermediate structure in a process for manufacturing a complex channel transistor, and FIGS. 6B and 6C are sectional views of the intermediate structure in accordance with an example embodiment of the disclosed invention.

FIG. 13A is a top plane view of an intermediate structure in a process for manufacturing a complex channel transistor, and FIGS. 13B, 13C and 13D are sectional views of the intermediate structure in accordance with an example embodiment of the disclosed invention.

FIG. 24A is a top plane view of an intermediate structure in a process for manufacturing a complex channel transistor, and FIGS. 24B 24C and 24D are sectional views of the intermediate structure in accordance with an example embodiment of the disclosed invention.

DETAILED DESCRIPTION OF EMBODIMENTS

Figures 1A, 1B, 1C:
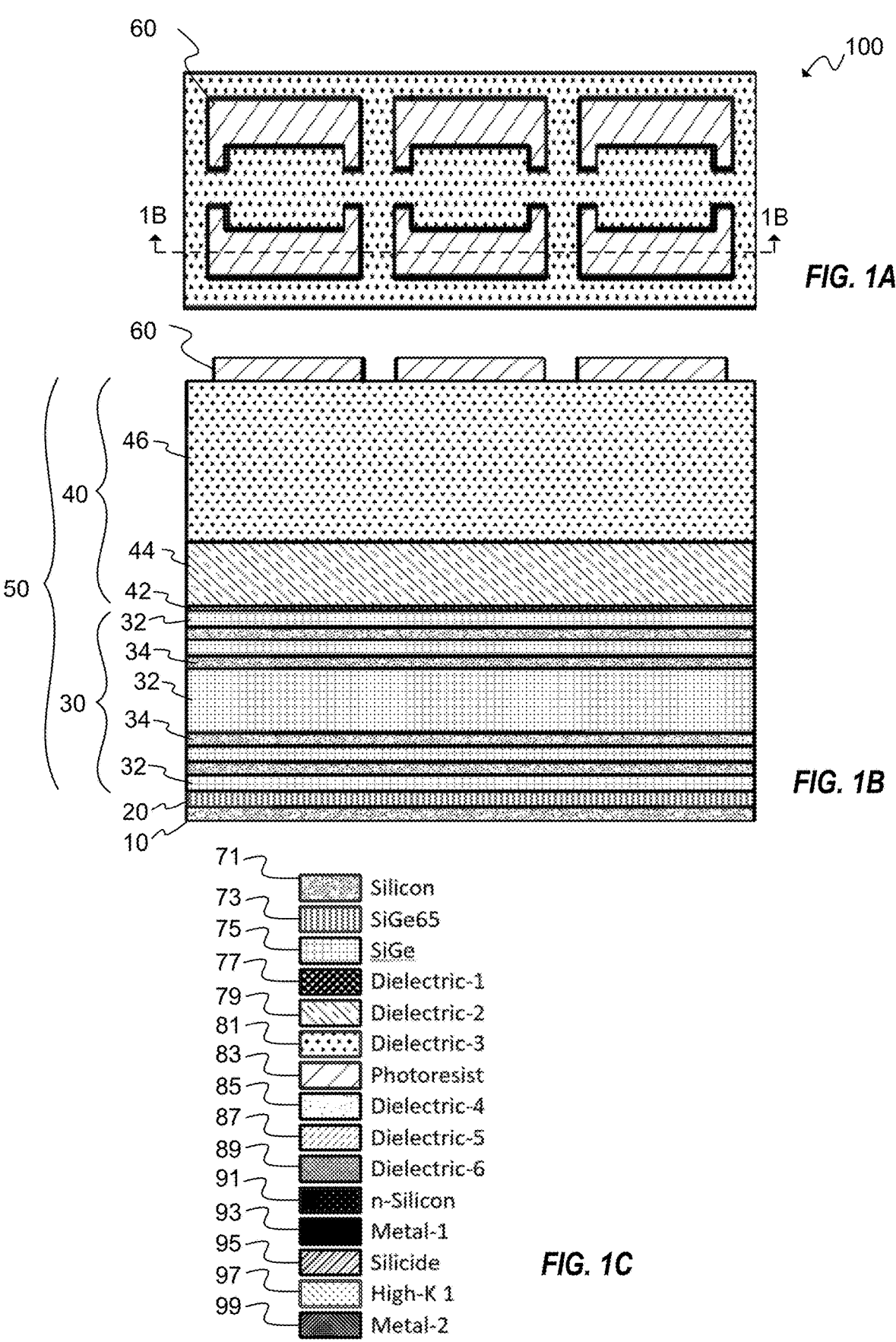
FIG. 1A is a top plane view of an intermediate structure in a process for manufacturing a complex channel transistor.
FIG. 1B is a sectional view of the intermediate structure in accordance with an example embodiment of the disclosed invention.
FIG. 1C is a materials legend for the drawings.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein in reference to various fabrication methods have been presented for clarity's sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

FIGS. 1A and 1B illustrate a structure 100 in which a patterned photoresist mask 60 is provided on an initial stack 50 formed on a substrate 10. FIG. 1A is a top plane view of the structure 100 and FIG. 1B is side view at section 1B-1B of the structure 100. The initial stack includes a dummy isolation layer 20, a stack of alternating semiconductor layers 30, and a stack of dielectric layers 40 provided in sequence on the substrate 10. In the example embodiment of FIGS. 1A and 1B, the dummy isolation layer 20 is an epi-grown SiGe65 on top of Si substrate 10. The alternating semiconductor layers 30 of this example are epi-grown in a sequence of alternating SiGe layers 32 and Si layers 34 layers four times with thickness variation as shown in cross-sectional image 1B, and with another SiGe layer 32 to finish the stack 30. Then the stack of dielectric layers 40 is formed to include layers having different etch selectivity from each other. A protective layer 42 of dielectric-1, followed by hard mask layer 44 of dielectric-2, and a top coating for a masking layer 46 of dielectric-3. An example of dielectric-1 is a protective oxide, an example of dielectric-2 is a nitride hard mask and a protecting top layer as per etch selectivity.

The example materials of FIGS. 1A and 1B are depicted throughout the drawings by way of material patterns shown in the legend of FIG. 1C. In the legend, pattern 71 is Si, pattern 73 is SiGe65, pattern 75 is SiGe, pattern 77 is dielectric-1, pattern 79 is dielectric-2, pattern 81 is dielectric-3, pattern 83 is photoresist, pattern 85 is dielectric-4, pattern 87 is dielectric-5, pattern 89 is dielectric-6, pattern 91 is n-doped Si, pattern 93 is metal-1, pattern 95 is silicide, pattern 97 is high-k material and pattern 99 is metal-2.

Figures 2A, 2B, 2C:
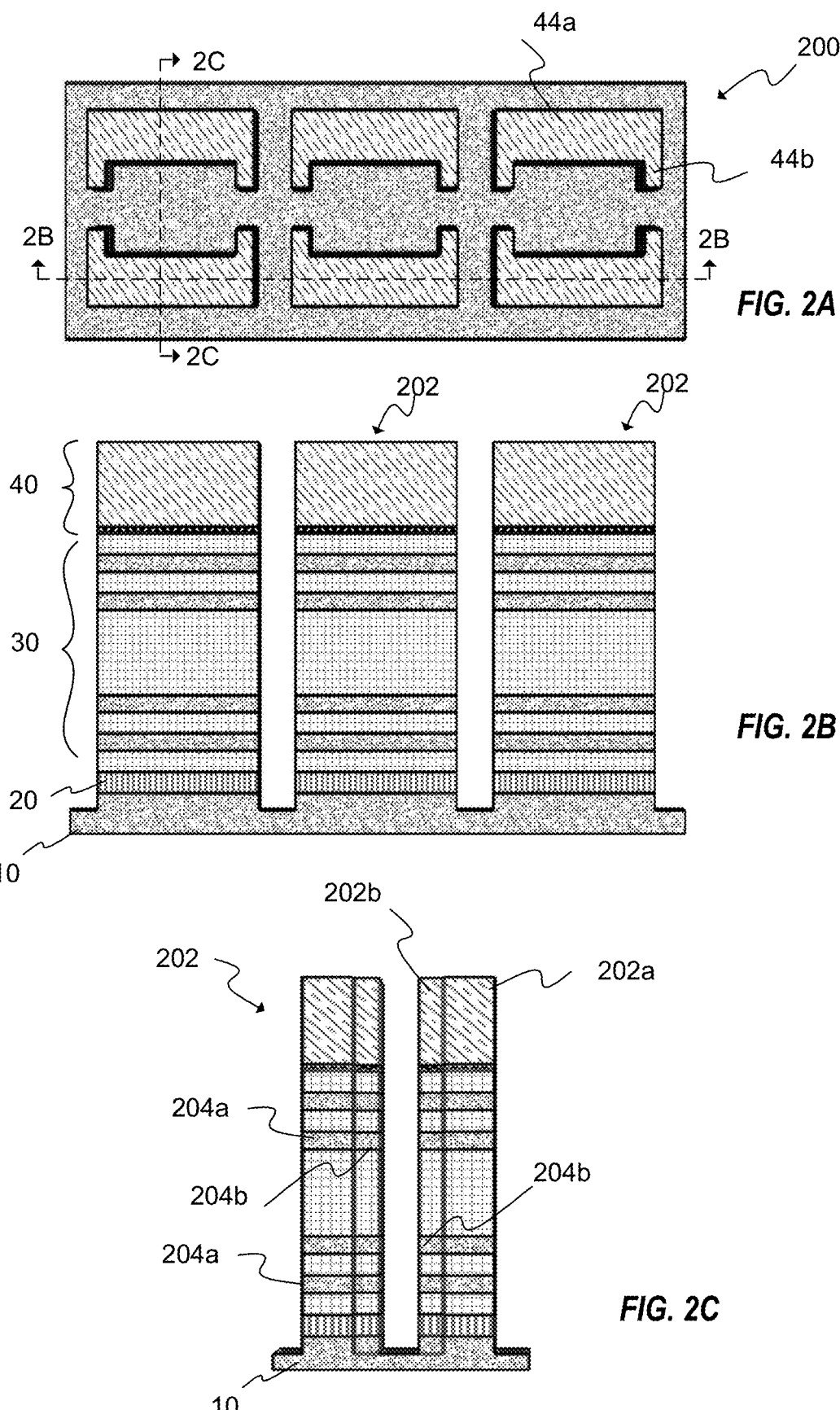
FIG. 2A is a top plane view of an intermediate structure in a process for manufacturing a complex channel transistor.
FIGS. 2B and 2C are sectional views of the intermediate structure in accordance with an example embodiment of the disclosed invention.

FIGS. 2A, 2B and 2C show a structure 200 after pattern etching the initial stack 50 with photoresist mask 60. FIG. 2A is a top plane view of the structure 200, FIG. 2B is side view at section 2B-2B, and FIG. 2C is a side view at section 2C-2C of the structure 200. This convention of providing section line labels that correspond to the figure number of the associated section view is used throughout this disclosure. The mask is a nanosheet mask used to etch the initial stack 50 all the way to Si substrate 10 step-by-step. As seen from the top view 2A, the patterned hard mask 44 includes a main portion 44a and tail portions 44b. The resulting etched structure includes patterned stacks 202 in the shape of the mask pattern with a main portion 202a and tail portions 202b. The patterned stacks 202 include patterned channel structures or nanosheets having a main channel portion 204a and tail channel portions 204b.

Figure 3A:
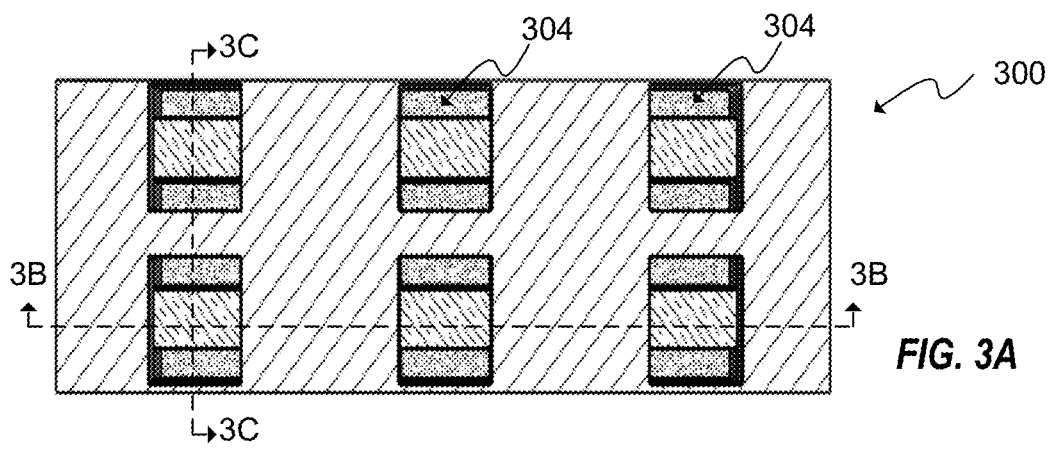
FIG. 3A is a top plane view of an intermediate structure in a process for manufacturing a complex channel transistor.
Figure 3B:
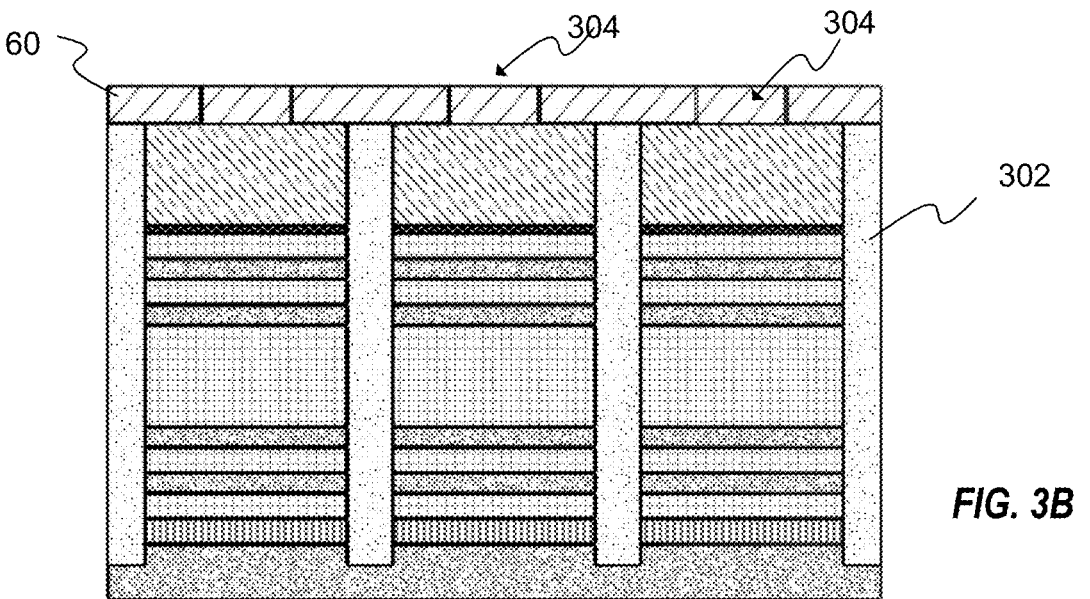
FIGS. 3B and 3C are sectional views of the intermediate structure in accordance with an example embodiment of the disclosed invention.
Figure 3C:
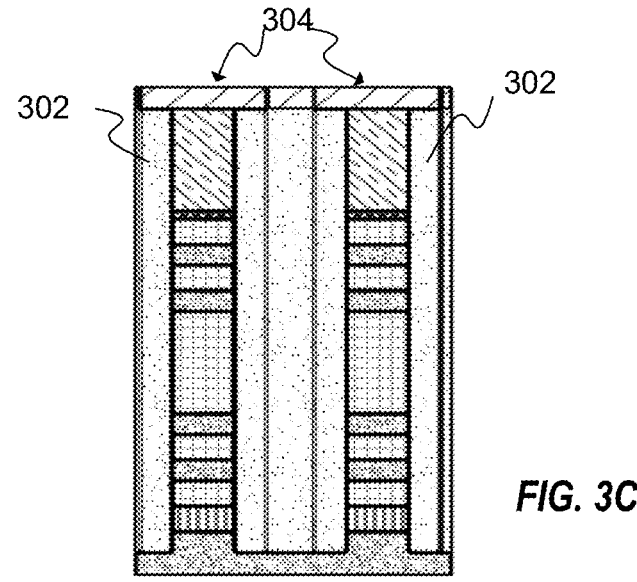

FIGS. 3A, 3B and 3C show a structure 300 after forming dummy gate openings 304. In one example process for forming dummy gate openings 304, the structure 200 is filled with fill material 302 of dielectric-4 and chemical mechanical polished (CMP). A photoresist dummy gate mask 60 is used to etch dummy gate openings 304 dielectric-4 directionally down to the substrate 10. The openings 304 expose sides of the main portion 202a of the patterned stack 202.

Figure 4A:
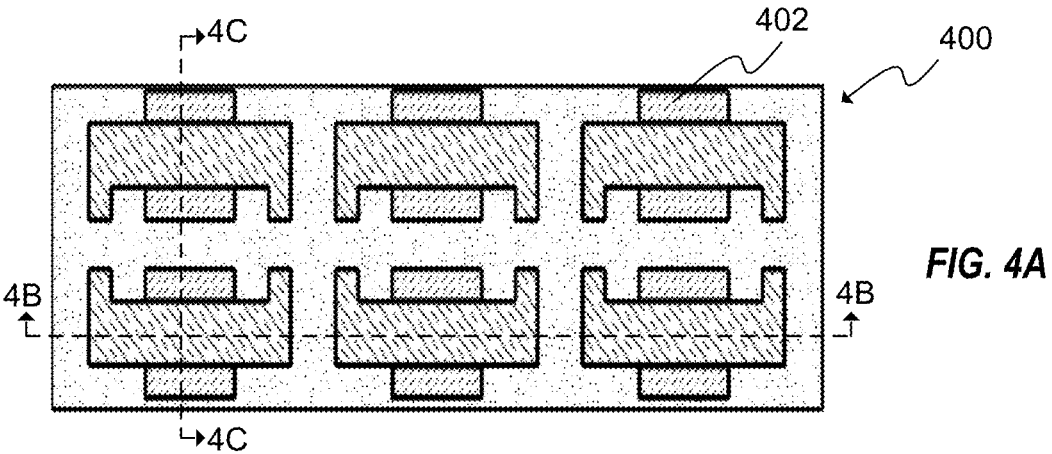
FIG. 4A is a top plane view of an intermediate structure in a process for manufacturing a complex channel transistor.
Figure 4B:
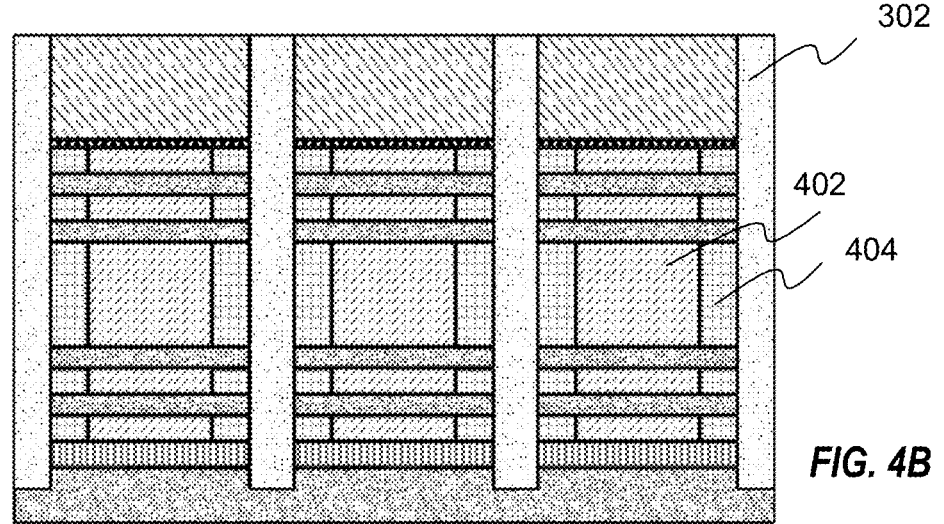
FIGS. 4B and 4C are sectional views of the intermediate structure in accordance with an example embodiment of the disclosed invention.
Figure 4C:
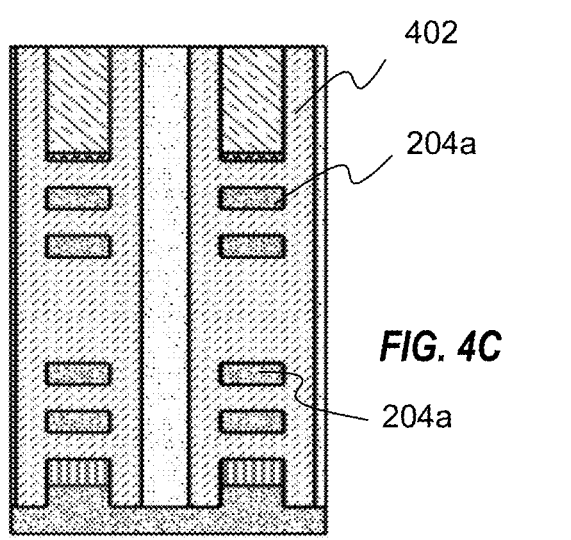

FIGS. 4A, 4B and 4C show a structure 400 after replacing SiGe material from a main portion 202a of the patterned stack 202 with dummy gate material 402. An example process includes etching exposed parts of the SiGe layers and depositing a fill dielectric-5 as dummy gate 402, and CMP to protect the gate area (dummy gate). This also defines the inner spacer area 404 for doping and channel area to be surrounded gate all around (GAA) structure.

Figure 5D:
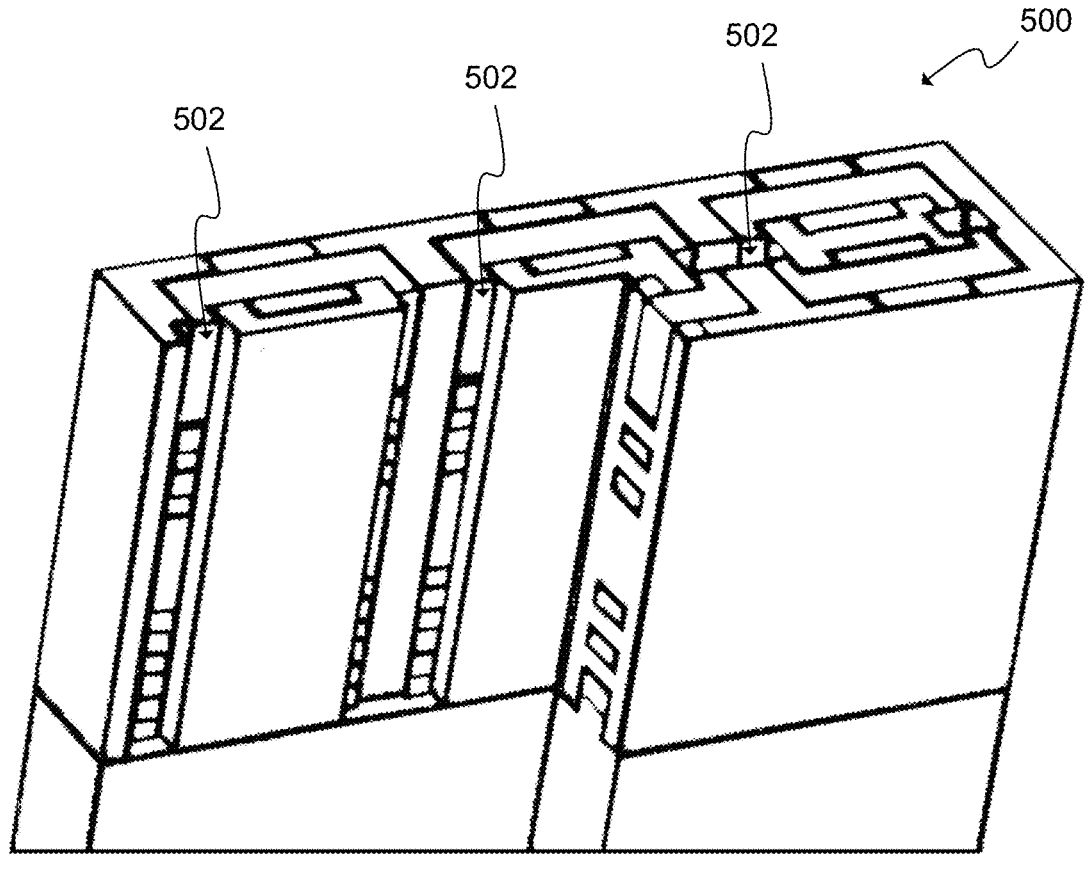
FIG. 5A is a top plane view of an intermediate structure in a process for manufacturing a complex channel transistor.
FIGS. 5B and 5C are sectional views and 5D is a perspective view of the intermediate structure in accordance with an example embodiment of the disclosed invention.

FIGS. 5A, 5B and 5C show a structure 500 for patterning with a dummy pillar mask 60. The mask includes pillar openings 502 for forming pillars to physically support the source-drain (S-D) extension of the transistors. The fill 302 of dielectric-4 is etched all the way to Si substrate to form pillar openings 502. FIG. 5D shows a perspective view of the structure 500 without material patterns for clarity of structure boundaries. FIGS. 6A, 6B and 6C show a structure 600 after depositing a fill of dielectric-6 to and CMP to form pillars 602.

Figures 7A, 7B, 7C:
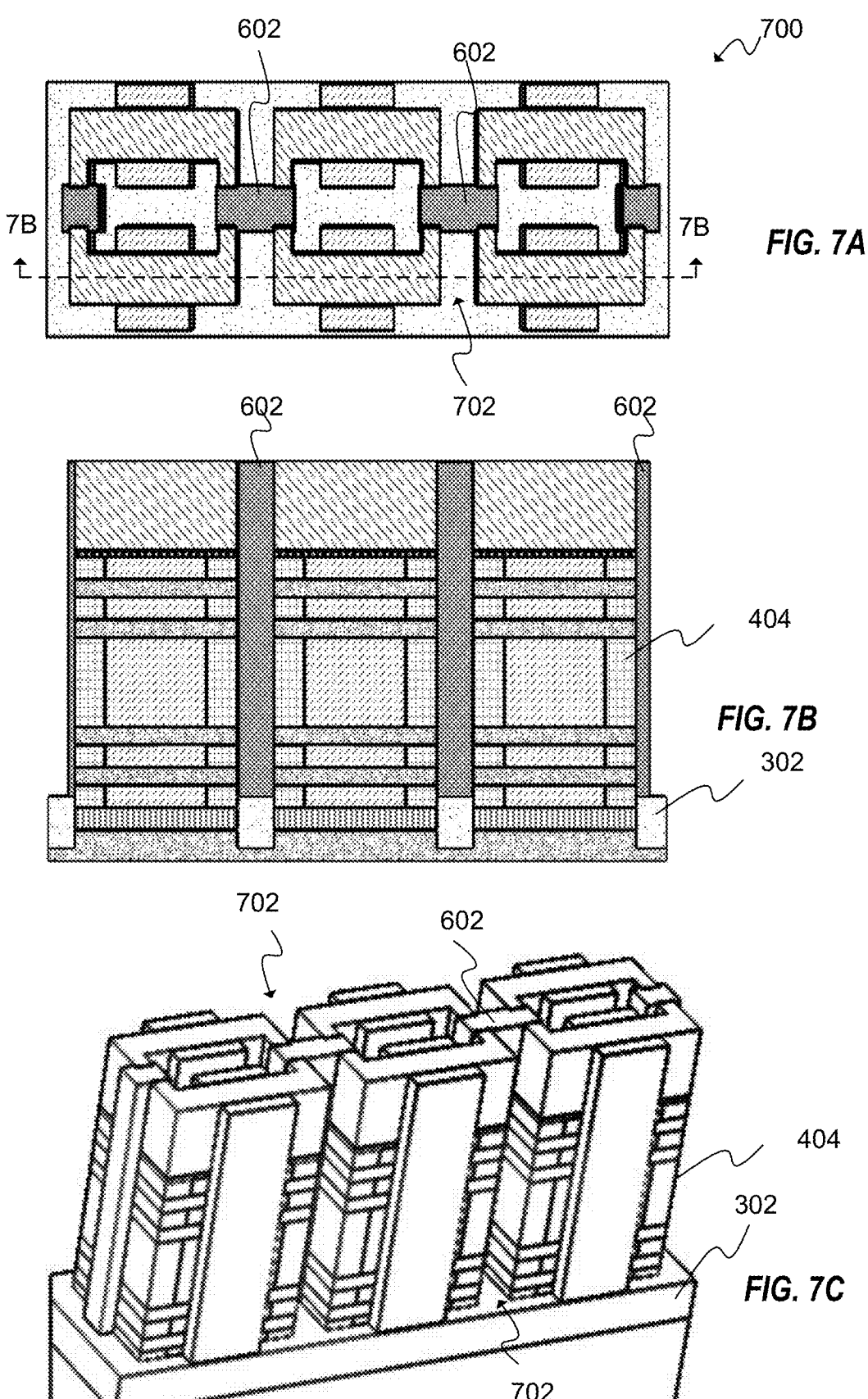
FIG. 7A is a top plane view of an intermediate structure in a process for manufacturing a complex channel transistor.
FIG. 7B is a sectional view and FIG. 7C is a perspective view of the intermediate structure in accordance with an example embodiment of the disclosed invention.

FIGS. 7A and 7B show a structure 700 after wet etch of dielectric-4 to open up the nanosheet channel structures. The etch results in openings 702 that expose the Si channel structures. This etch can be controlled and have plenty of room to stop well before reaching Si substrate 10 while etching past the lower most nanosheet. FIG. 7C shows a perspective view of the structure 700 without material patterns for clarity of structure boundaries.

Figure 8A:
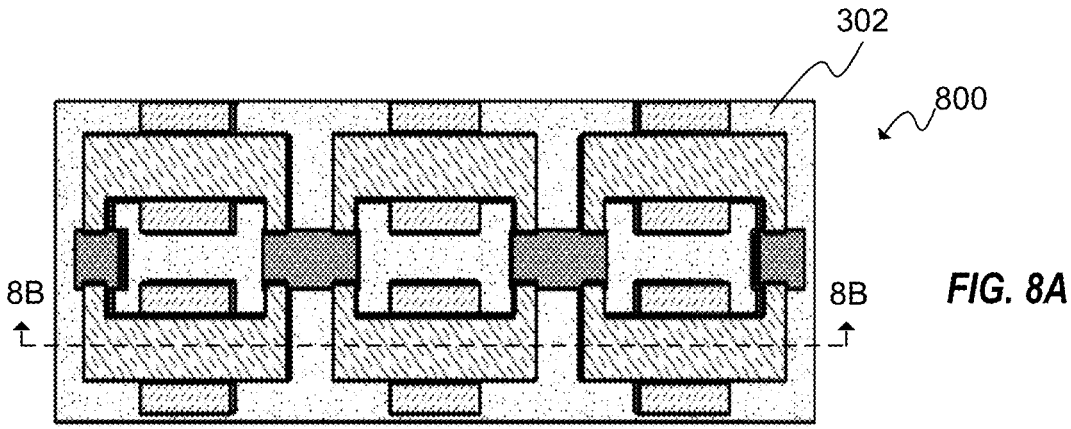
FIG. 8A is a top plane view of an intermediate structure in a process for manufacturing a complex channel transistor.
Figure 8B:
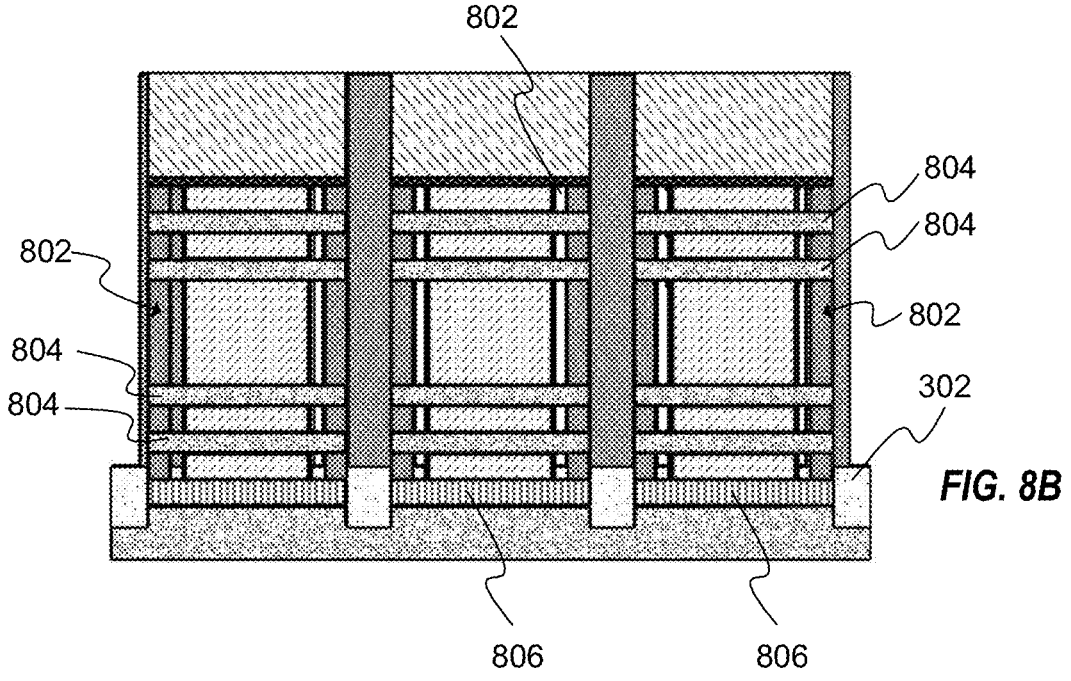
FIG. 8B is a sectional view and FIG. 8C is a perspective view of the intermediate structure in accordance with an example embodiment of the disclosed invention.
Figure 8C:
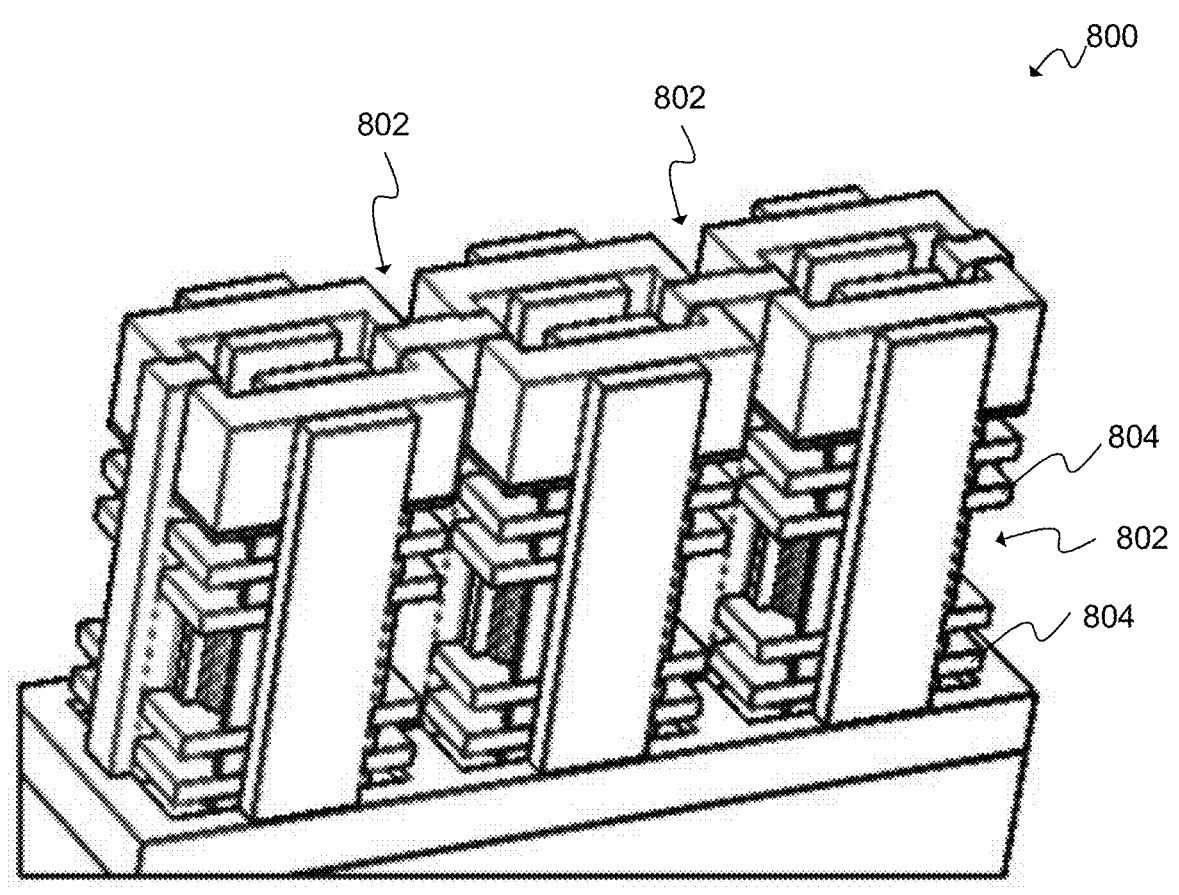
Figure 9A:
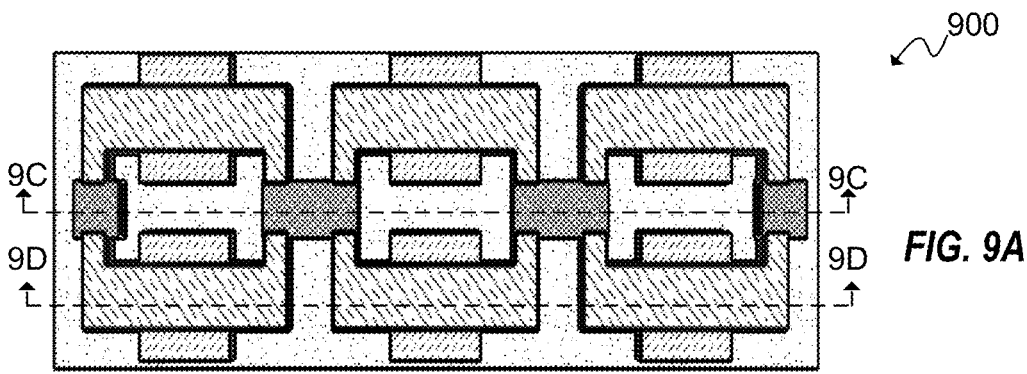
FIG. 9A is a top plane view of an intermediate structure in a process for manufacturing a complex channel transistor.
Figure 9B:
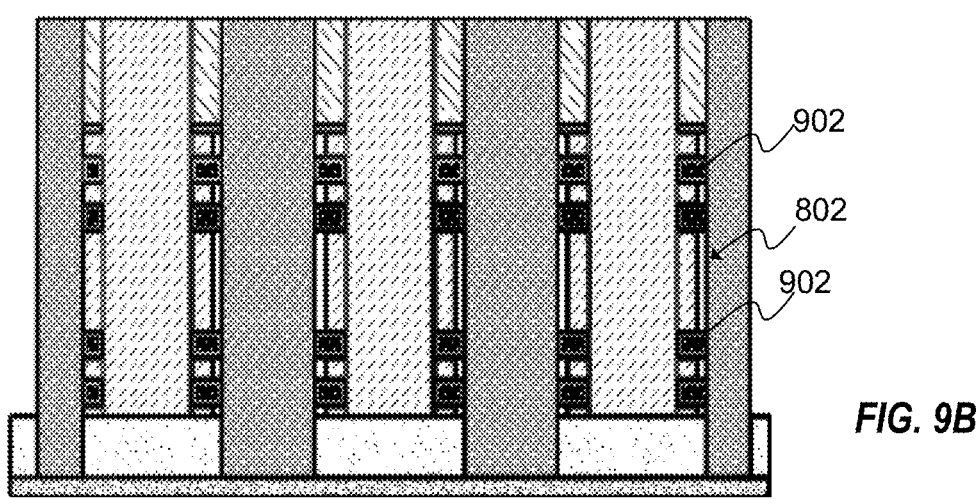
FIGS. 9B and 9C are sectional views and 9D is a perspective view of the intermediate structure in accordance with an example embodiment of the disclosed invention.
Figure 9C:
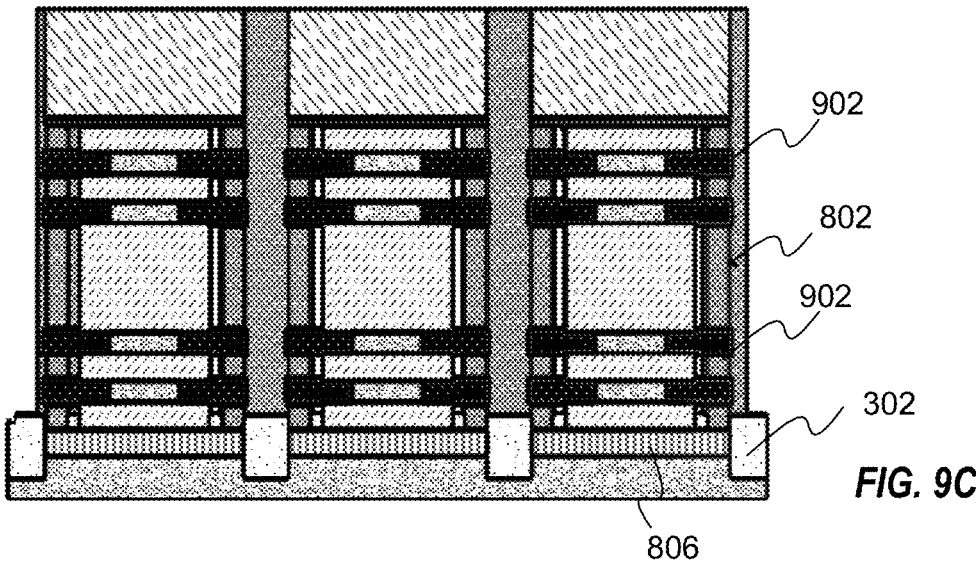
Figure 9D:
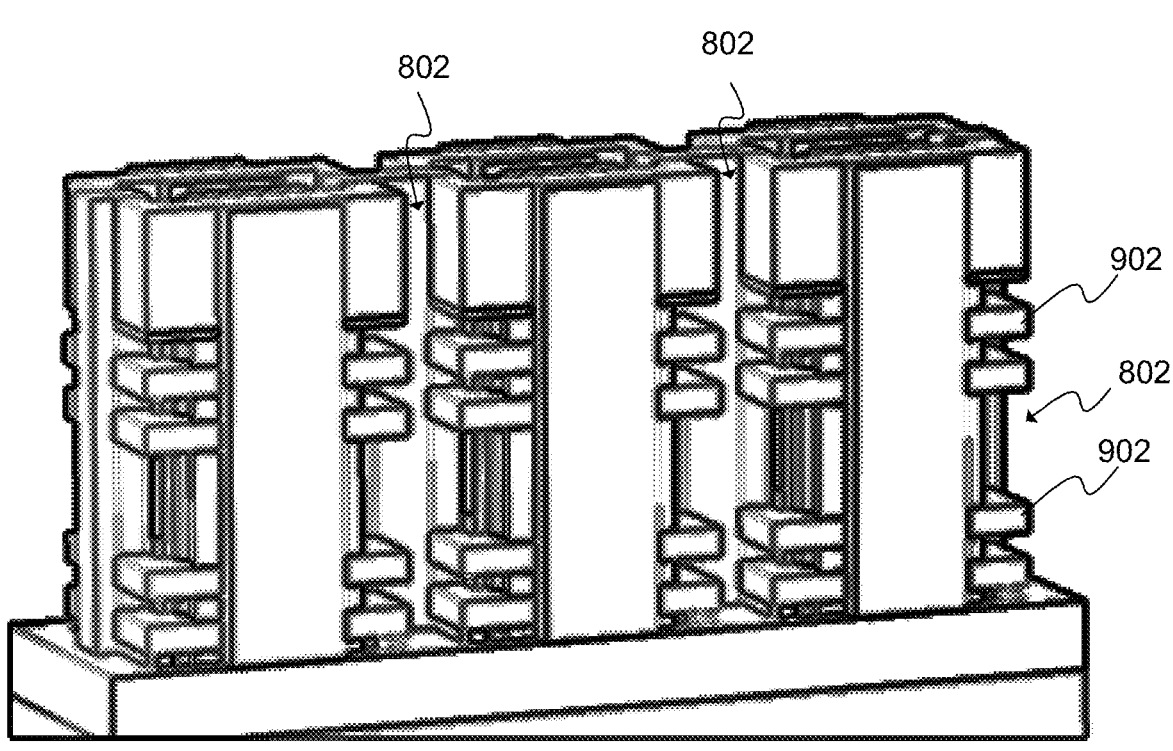

FIGS. 8A and 8B show a structure 800 after wet etch of the remaining SiGe which forms inner spacer 404 to form openings 802 that expose the nanosheet ends 804 for pulse doping. The whole structure is supported by dummy gate 402 and dummy pillar 602. Dummy isolation 806 of SiGe65 maintains the isolation from the substrate. FIG. 8C shows a perspective view of the structure 800 without material patterns for clarity of structure boundaries. FIGS. 9A, 9B and 9C show a structure 900 after pulse plasma doping the silicon nanosheets with n+ to form source-drain (S-D) regions 902. FIG. 9D shows a perspective view of the structure 900 without material patterns for clarity of structure boundaries.

Figure 10D:
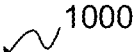
FIG. 10A is a top plane view of an intermediate structure in a process for manufacturing a complex channel transistor.
FIGS. 10B and 10C are sectional views and 10D is a perspective view of the intermediate structure in accordance with an example embodiment of the disclosed invention.
Figure 10D:
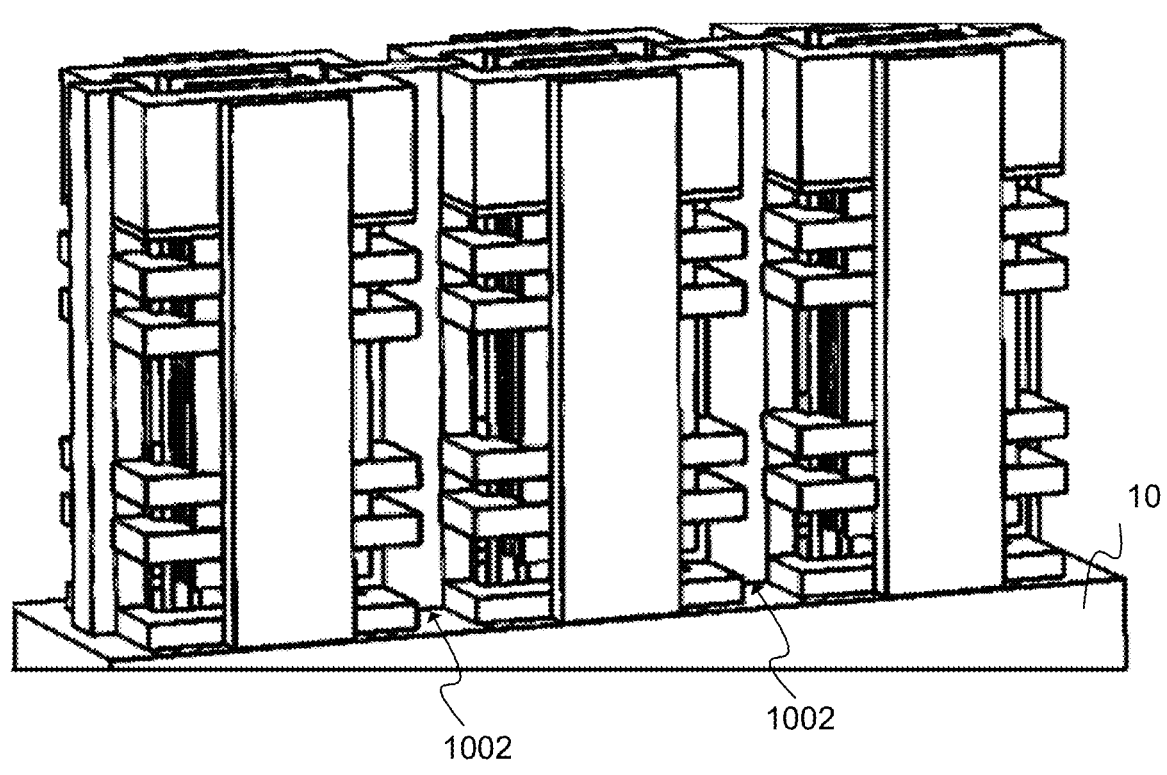
Figures 11A, 11B:
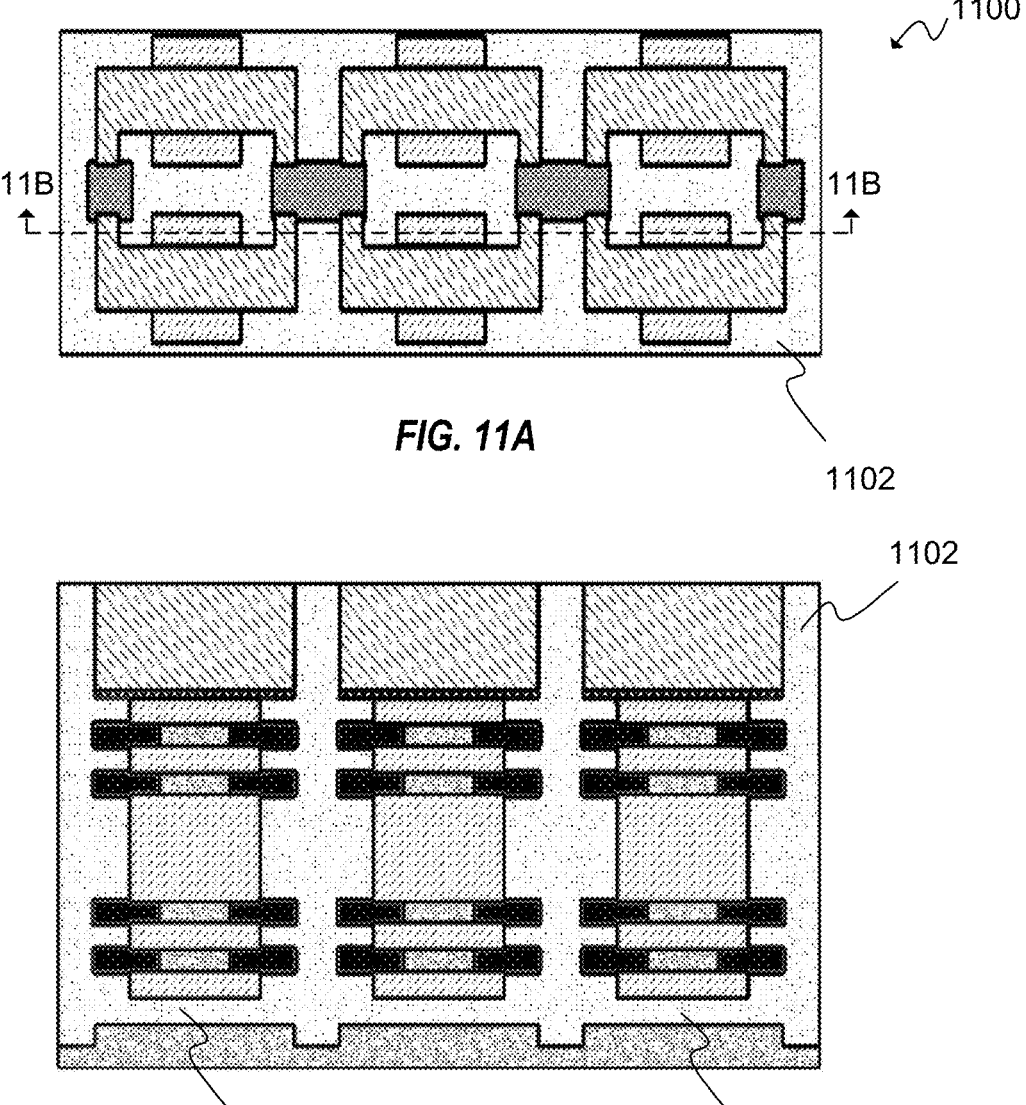
FIG. 11A is a top plane view of an intermediate structure in a process for manufacturing a complex channel transistor.
FIG. 11B is a sectional view of the intermediate structure in accordance with an example embodiment of the disclosed invention.
Figure 12A:
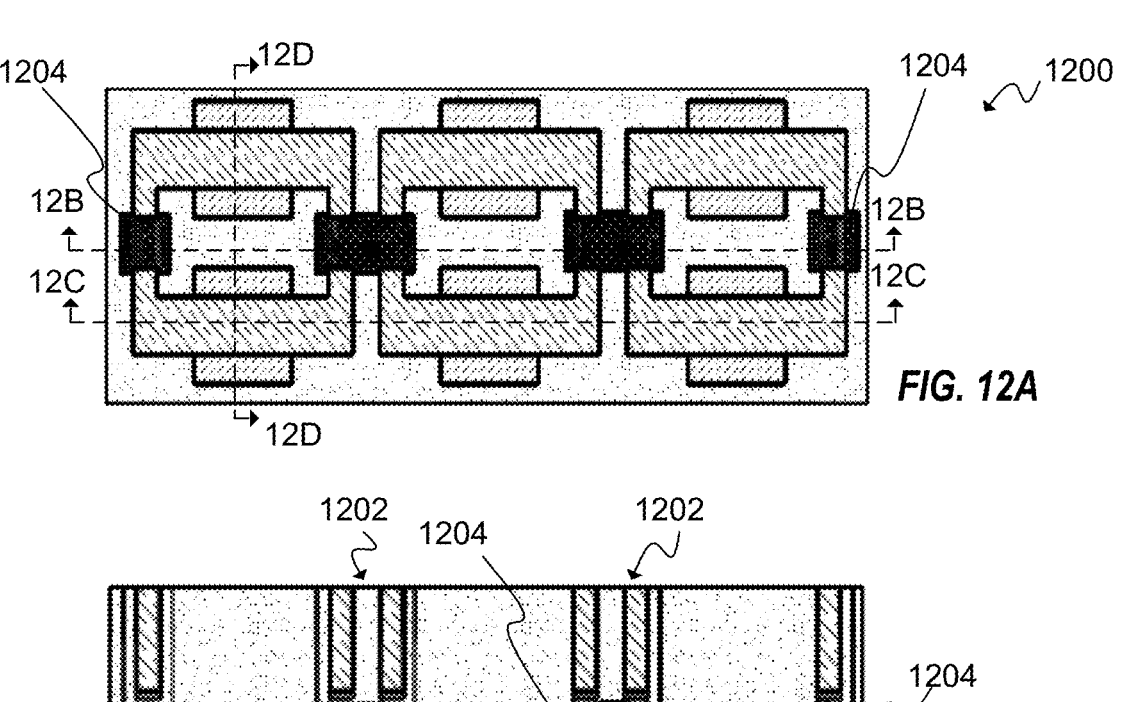
FIG. 12A is a top plane view of an intermediate structure in a process for manufacturing a complex channel transistor.
Figure 12B:
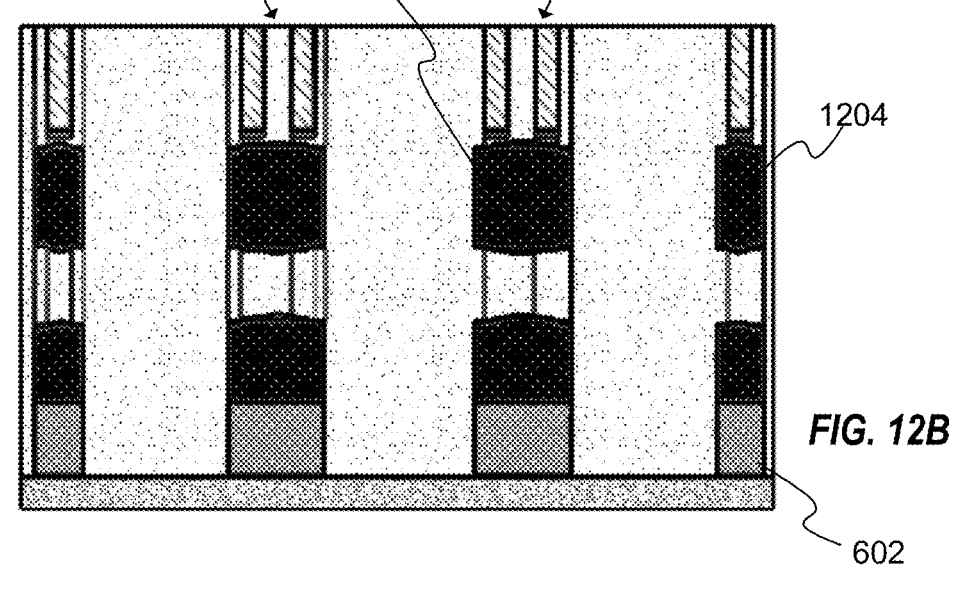
FIGS. 12B, 12C and 12D are sectional views of the intermediate structure in accordance with an example embodiment of the disclosed invention.
Figure 12C:
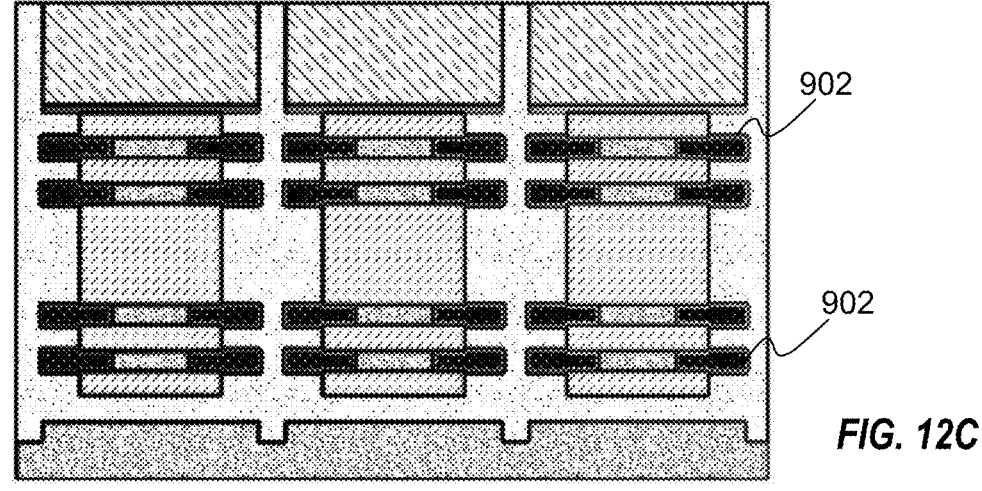
Figure 12D:
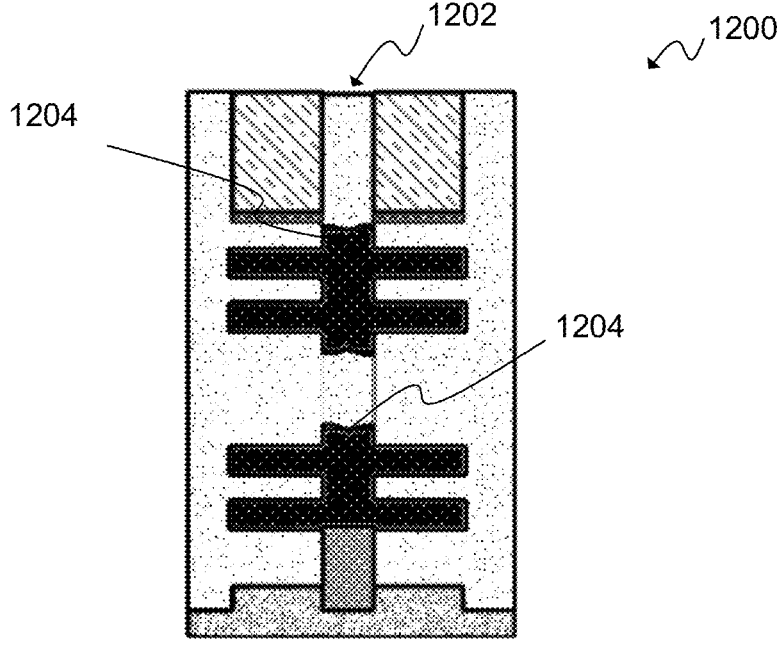
Figure 13D:
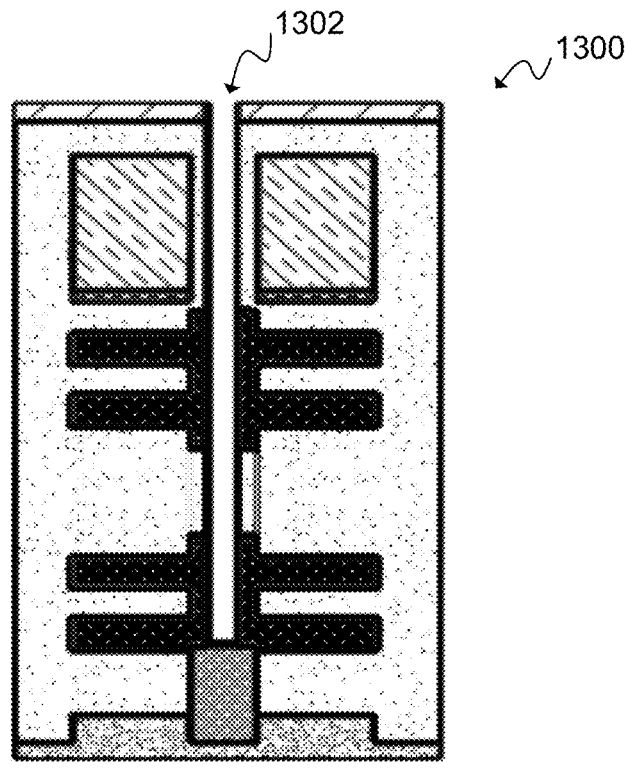

FIGS. 10A, 10B and 10C show a structure 1000 after removal of SiGe65 dummy isolation bottom layer 806. In one example, wet etch of the dielectric-4 fill is performed to access the SiGe65 dummy isolation bottom layer 806. Then etch removes SiGe65 to leave opening 1002. Transistors are well supported by the dummy pillars 602 and dummy gate 402. FIG. 10D shows a perspective view of the structure 1000 without material patterns for clarity of structure boundaries. FIGS. 11 and 11B show a structure 1100 after depositing fill 1102 of dielectric-4 and CMP to provide isolation 1104 from the substrate.

Figure 14A:
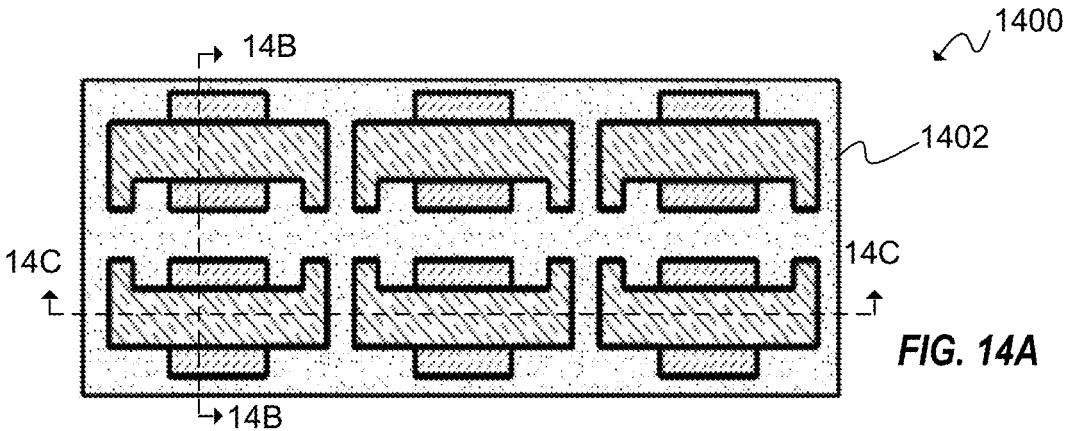
FIG. 14A is a top plane view of an intermediate structure in a process for manufacturing a complex channel transistor.
Figure 14B:
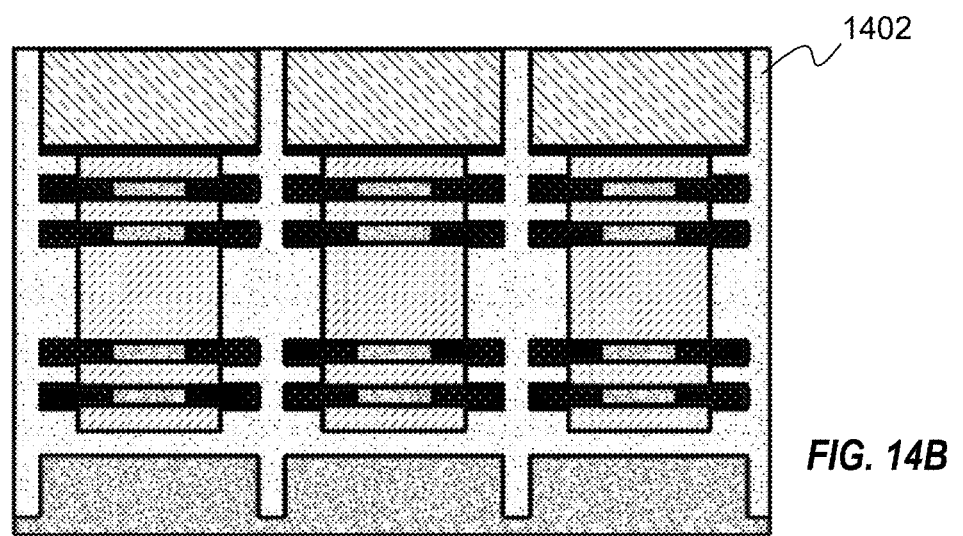
FIGS. 14B and 14C are sectional views of the intermediate structure in accordance with an example embodiment of the disclosed invention.
Figure 14C:
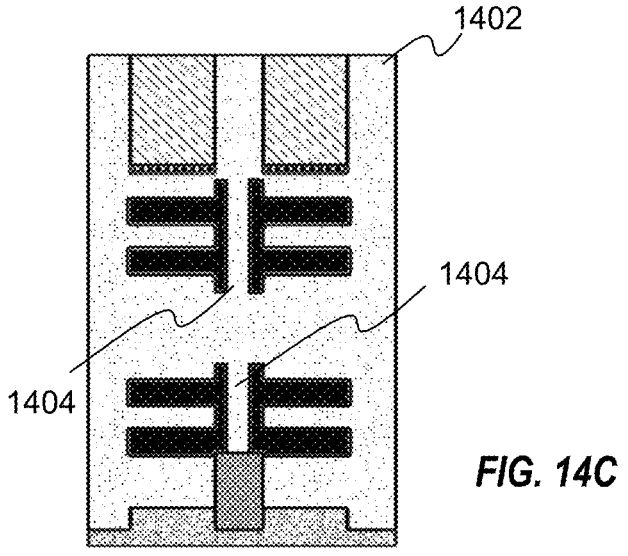
Figures 15A, 15B, 15C:
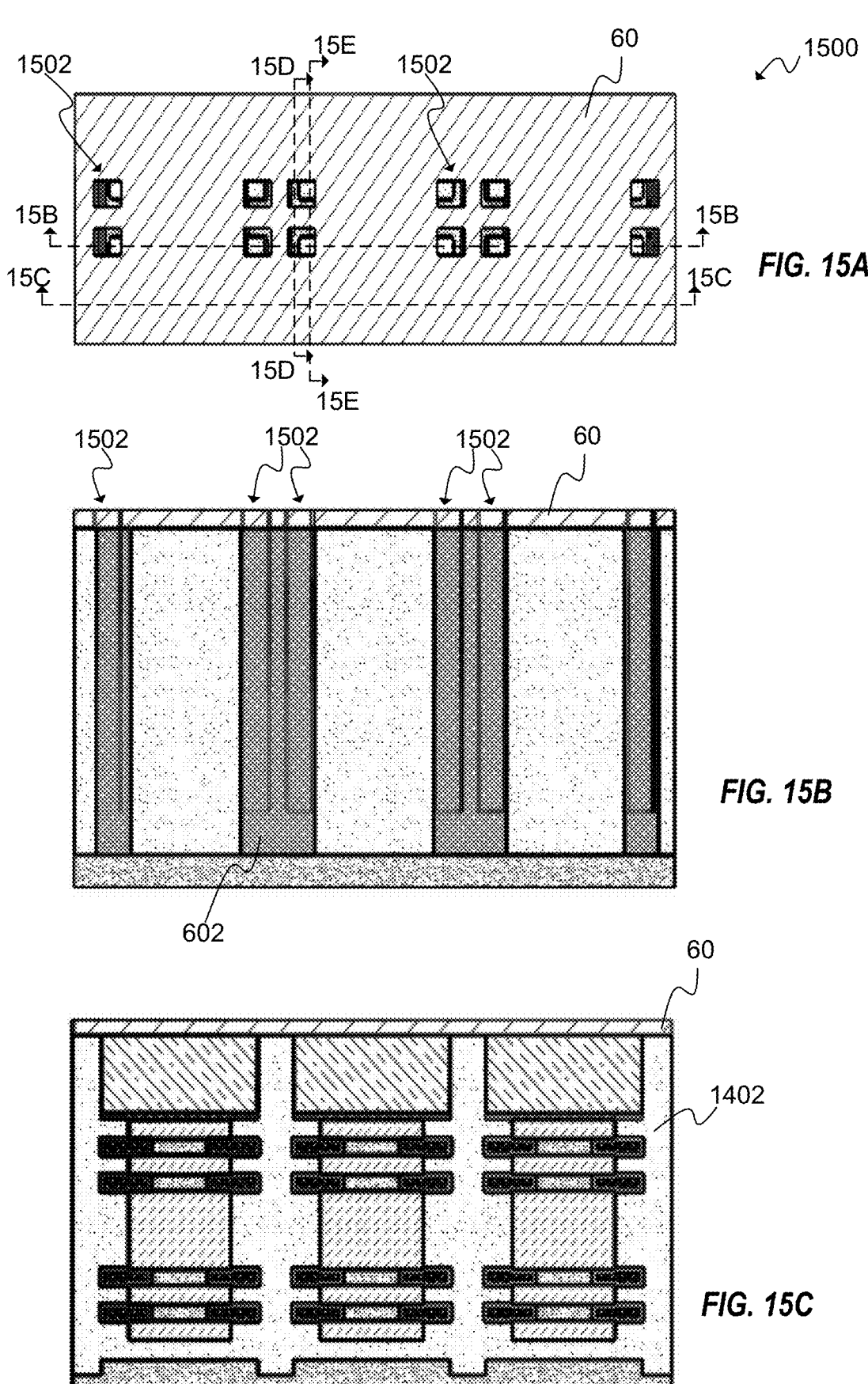
FIG. 15A is a top plane view of an intermediate structure in a process for manufacturing a complex channel transistor.
FIGS. 15B, 15C, 15D and 15E are sectional views of the intermediate structure in accordance with an example embodiment of the disclosed invention.
Figure 15D:
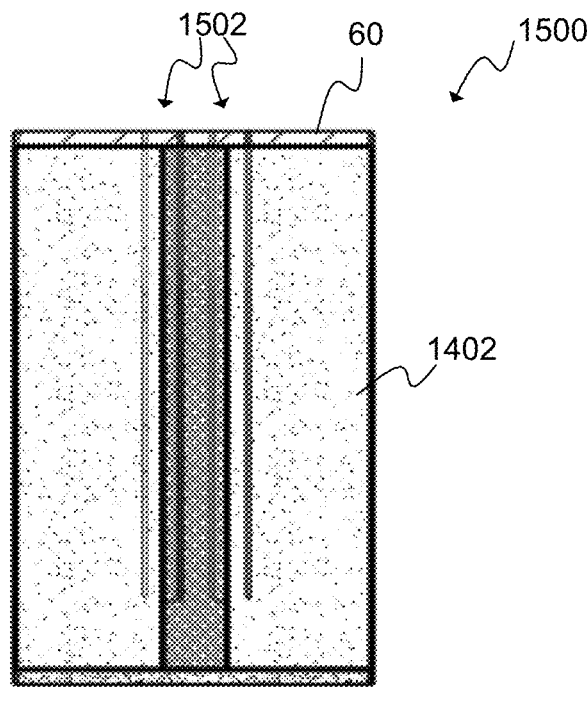
Figure 15E:
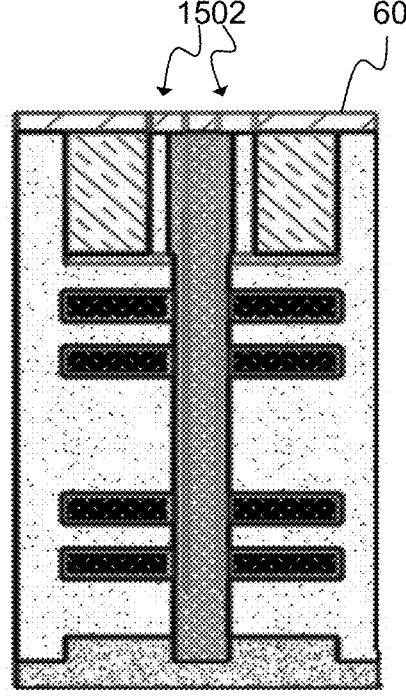
Figures 16A, 16B, 16C:
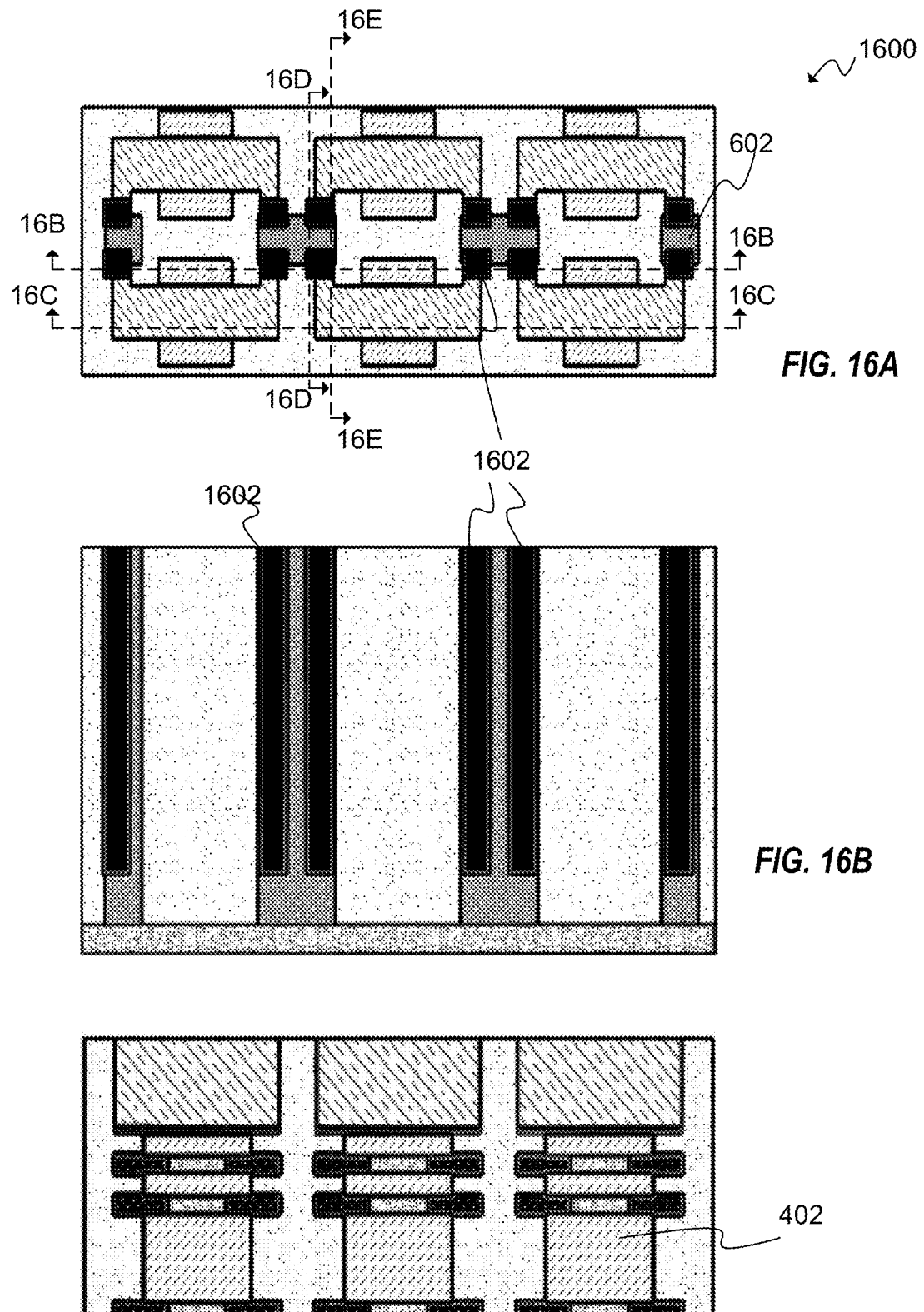
FIG. 16A is a top plane view of an intermediate structure in a process for manufacturing a complex channel transistor.
FIGS. 16B, 16C, 16D and 16E are sectional views of the intermediate structure in accordance with an example embodiment of the disclosed invention.
Figures 16D, 16E:
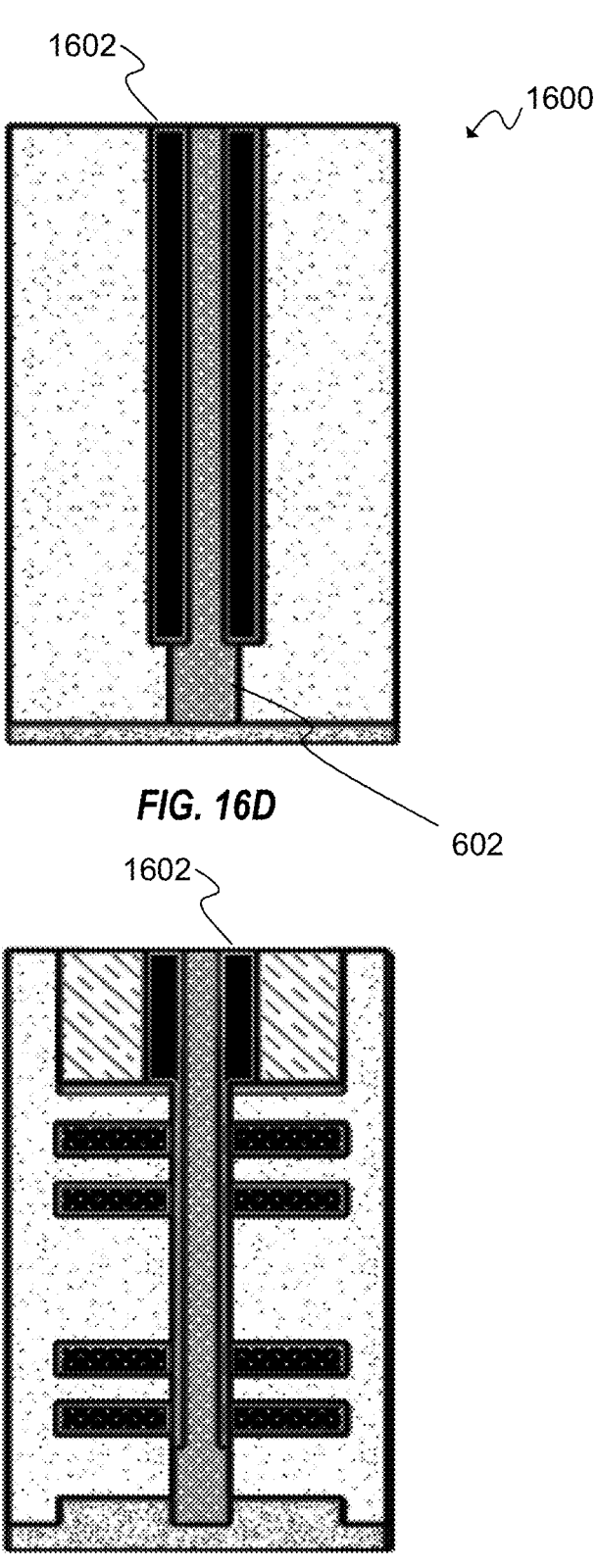
Figure 17A:
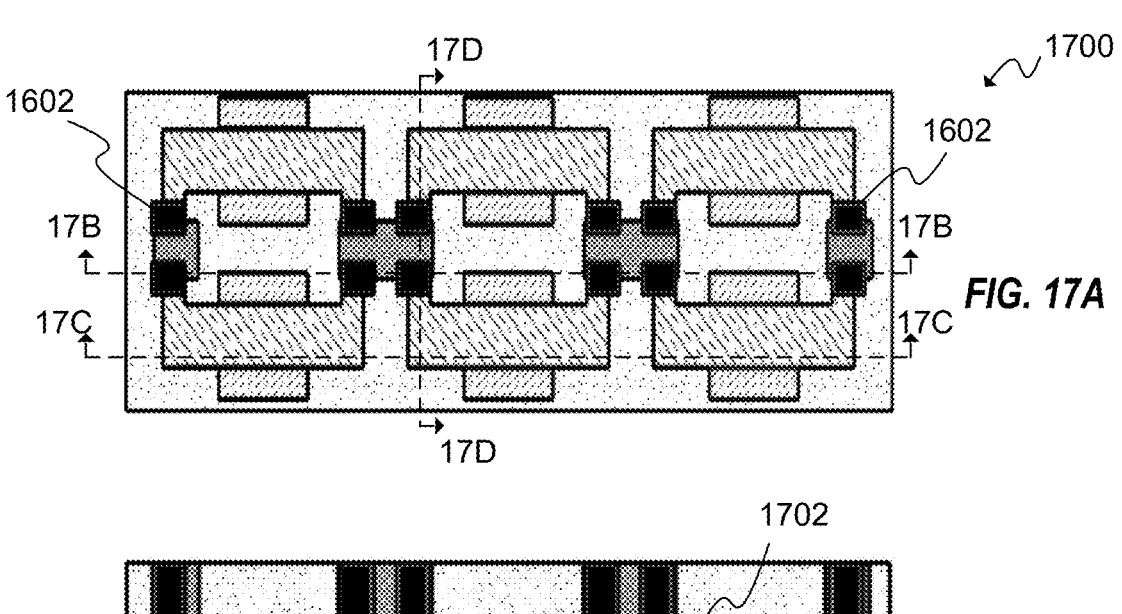
FIG. 17A is a top plane view of an intermediate structure in a process for manufacturing a complex channel transistor.
Figure 17B:
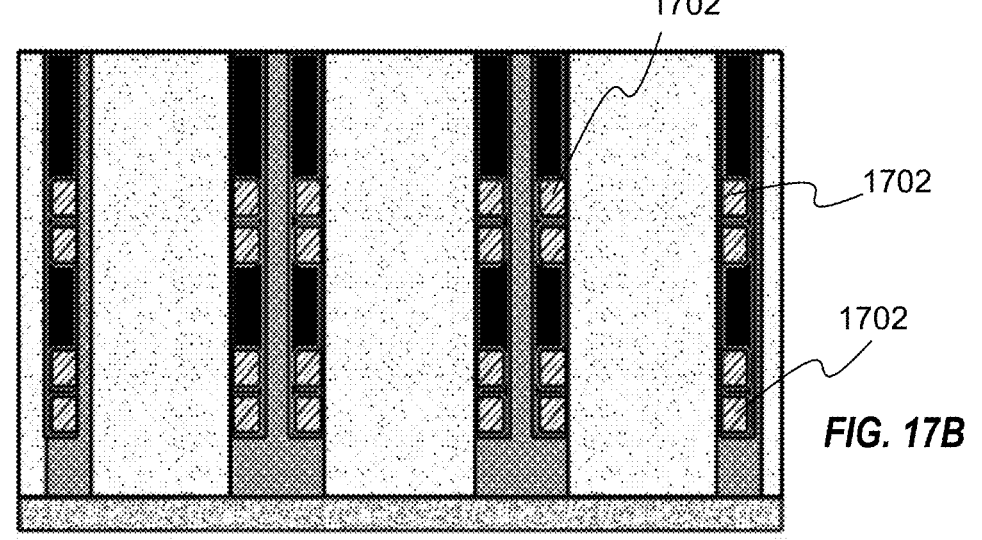
FIGS. 17B, 17C and 17D are sectional views of the intermediate structure in accordance with an example embodiment of the disclosed invention.
Figure 17C:
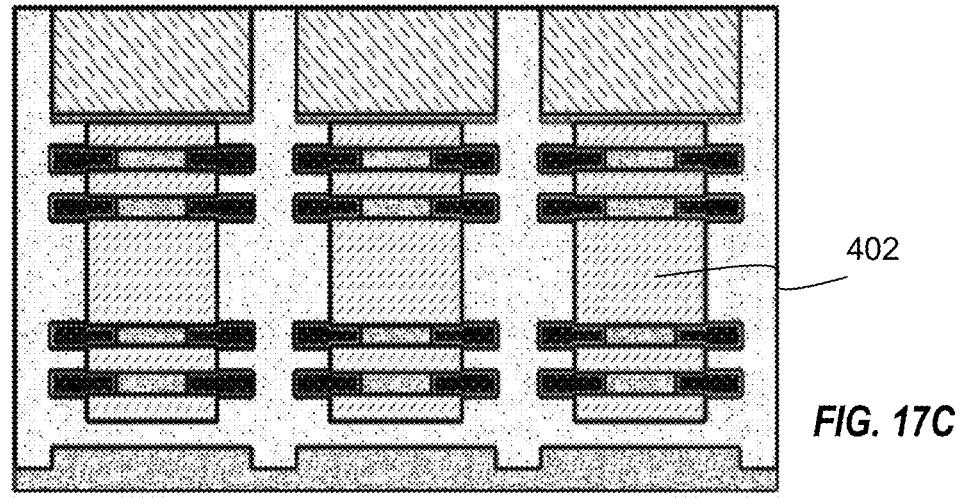
Figure 17D:
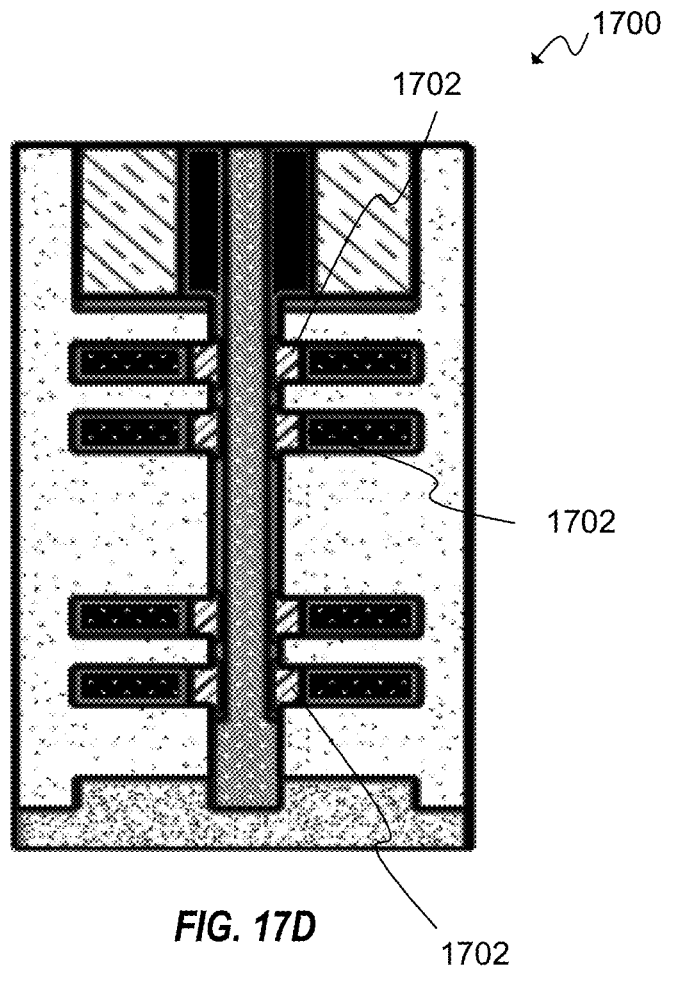

S-D end contacts are then formed by epitaxially growing doped silicon on n-Si nanosheet nodes for the S-D end contacts. An isolation mask is used to isolate the thick epilayers. FIGS. 12A, 12B, 12C and 12D show a structure 1200 after etch of dielectric-6 to create self-aligned spaces 1202 to access S-D end contacts 902 at a distal end of the tail portions of the nanosheet channel structure. Epitaxial growth of doped silicon on n-Si nodes 902 is performed to form contact regions 1204. Epitaxial growth will extend and connect to side-by-side and/or face-to-face transistors which are then isolated. FIGS. 13A, 13B, 13C and 13D show a structure 1300 after patterning with isolation mask 60 and etch contact regions 1204 with etch stop on dielectric-6 to form openings 1302. FIGS. 14A, 14B and 14C show a structure 1400 after depositing fill of dielectric-4 in openings and CMP.

An alternative method of forming S-D contacts which does not require epitaxial growth of the S-D contacts is by patterning for the contacts to deposit metals and annealing to form silicide. With this method, no isolation mask is needed like in the flow for epitaxial growth of the S-D contacts described above. FIGS. 15A, 15B, 15C, 15D and 15E show a structure 1500 after the step of FIG. 11 and further patterning with an S-D contact mask 60 and etching dielectric-4 so that all nanosheets can be accessed. Nanosheets are accessed through openings 1502. FIGS. 16A, 16B, 16C, 16D and 16E show a structure 1600 after depositing fill 1602 of metal-1 and CMP. Different views from X-axis cross-section shows the metal 1602 is extended away from the dummy gate where the gate contact will be formed. That also allows the metal to connect all the nanosheet from two sides and bolster the contact. FIGS. 17A, 17B, 17C, 17D and 17E show a structure 1700 after silicide of the metal-1 and n-Si by annealing to form S-D contacts 1702 and subsequent deposit of fill with dielectric-4 and CMP.

Channel release is then performed, and high-k and gate metal steps are performed independent of S-D contacts. These steps may be the same for both the epitaxial S-D contact flow and the silicide S-D contact flow described above.

Figure 18A:
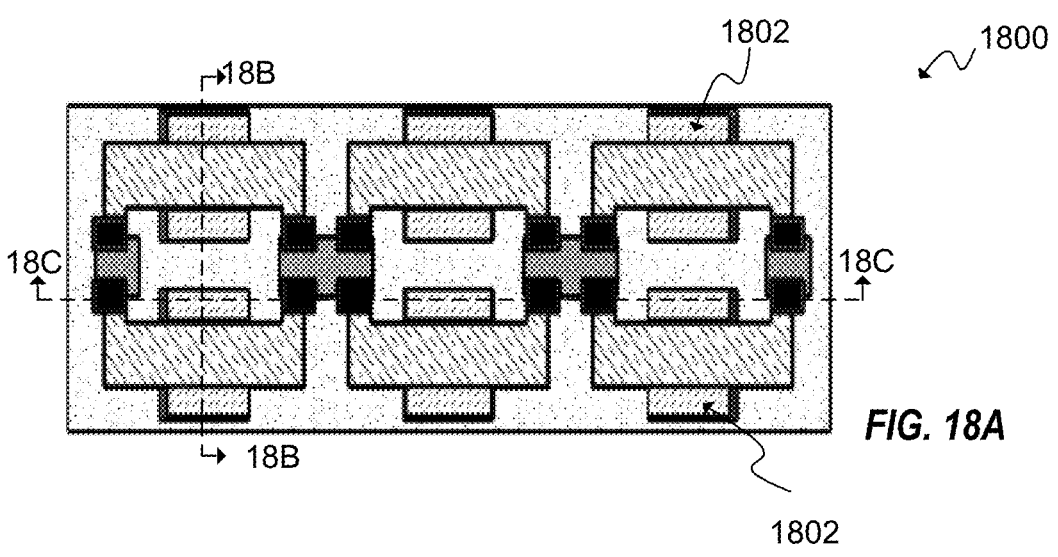
FIG. 18A is a top plane view of an intermediate structure in a process for manufacturing a complex channel transistor.
Figure 18B:
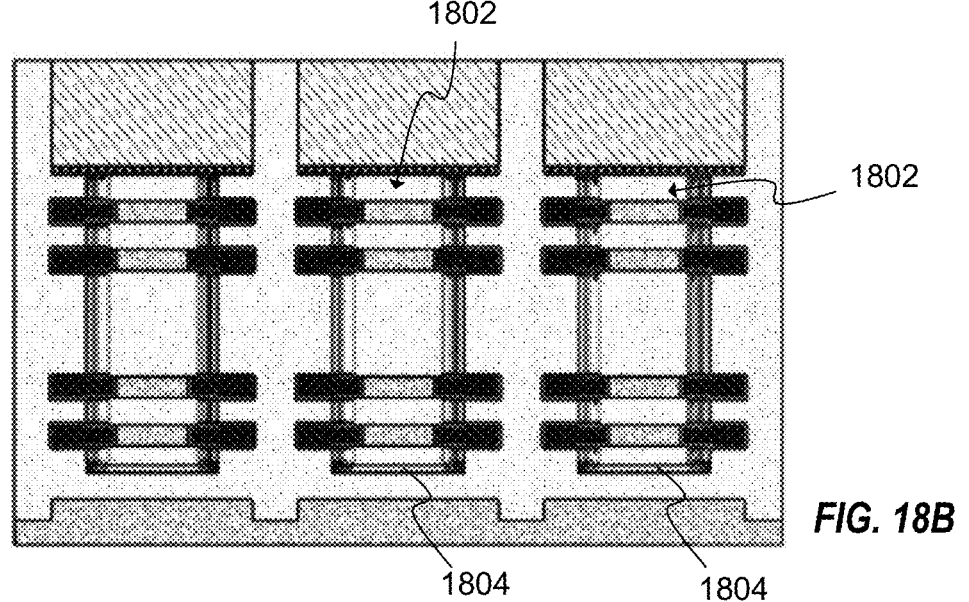
FIGS. 18B and 18C are sectional views of the intermediate structure in accordance with an example embodiment of the disclosed invention.
Figure 18C:
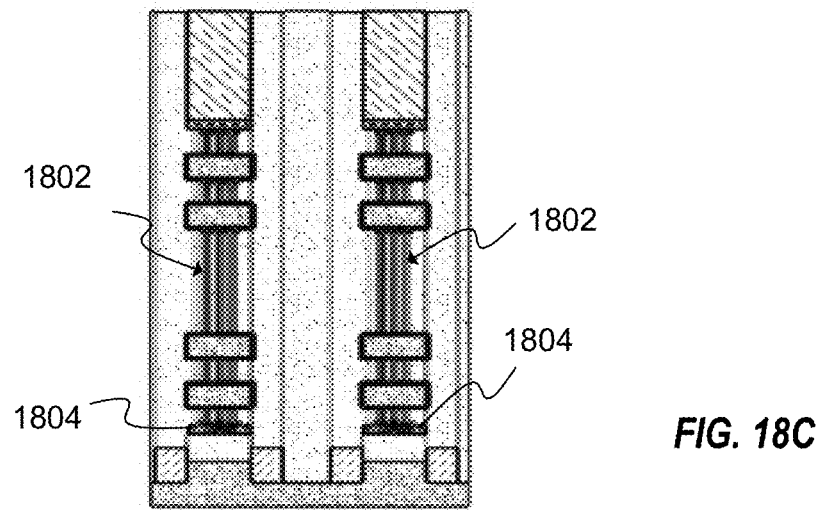
Figure 19A:
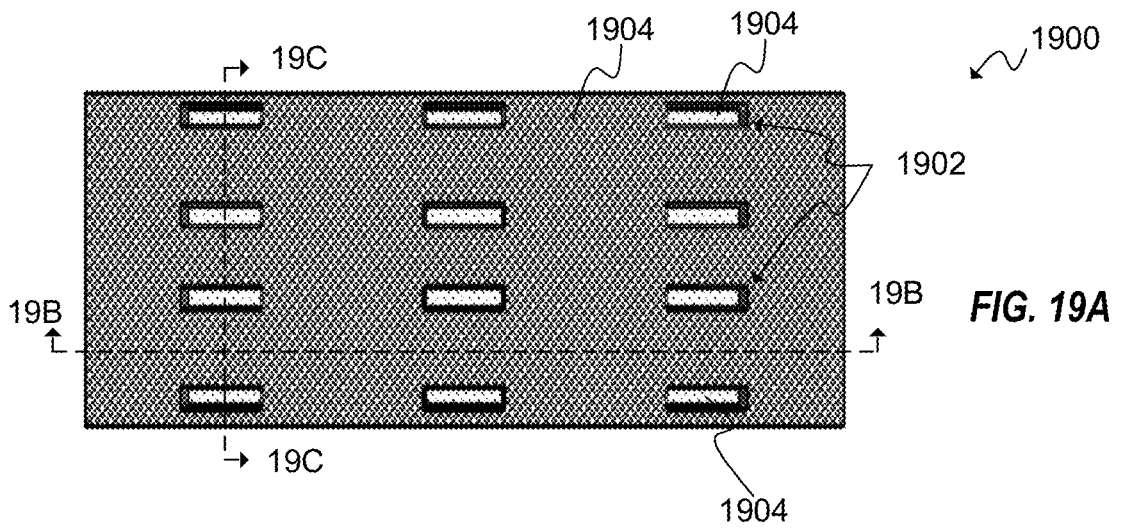
FIG. 19A is a top plane view of an intermediate structure in a process for manufacturing a complex channel transistor.
Figure 19B:
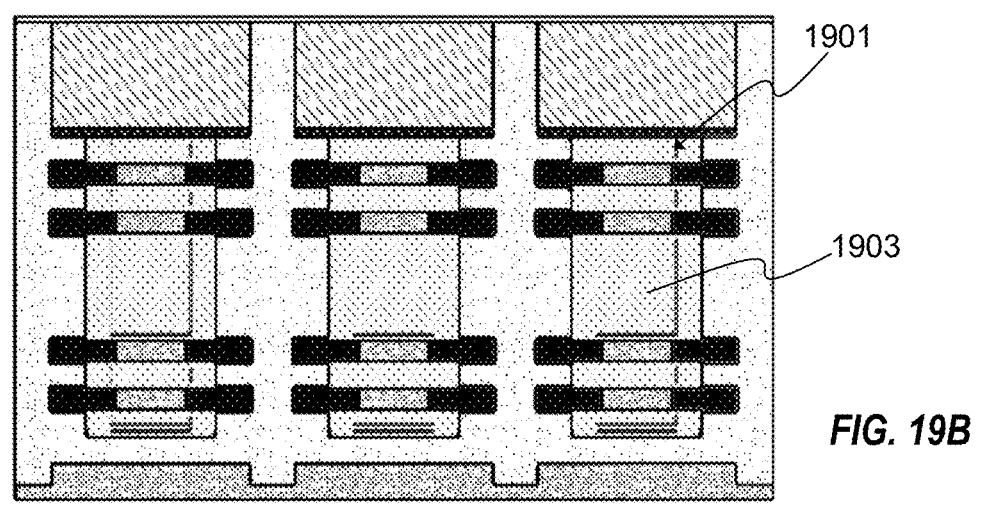
FIGS. 19B and 19C are sectional views of the intermediate structure in accordance with an example embodiment of the disclosed invention.
Figure 19C:
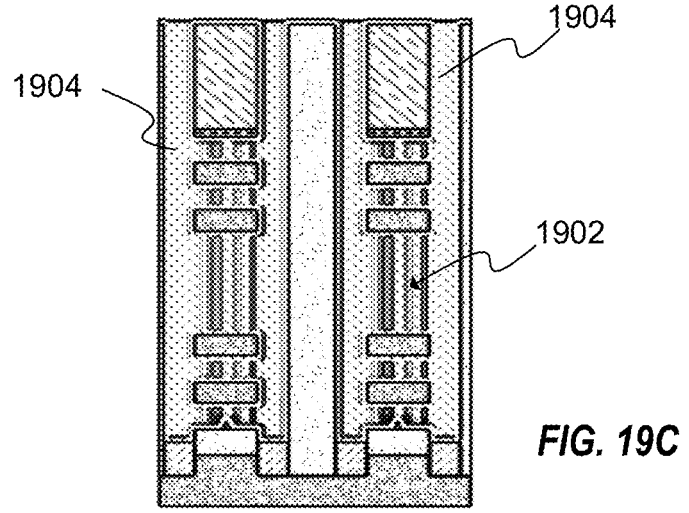
Figure 20A:
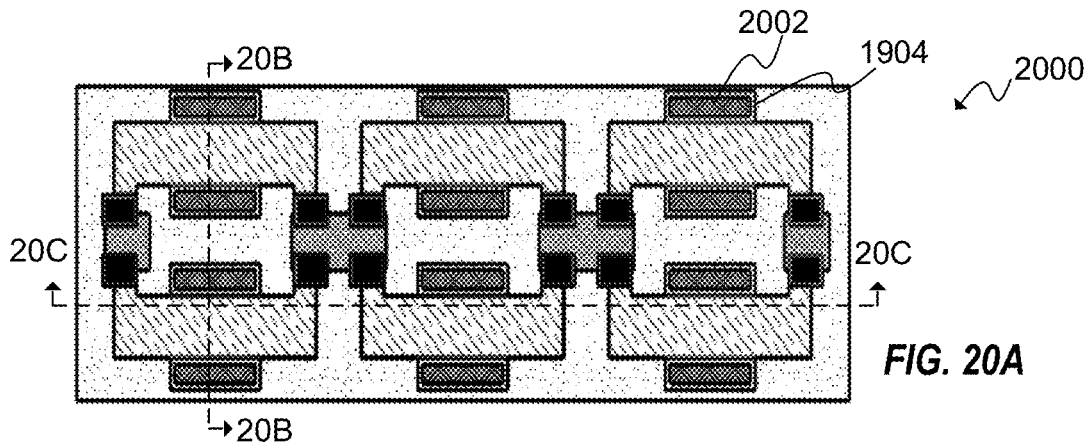
FIG. 20A is a top plane view of an intermediate structure in a process for manufacturing a complex channel transistor.
Figure 20B:
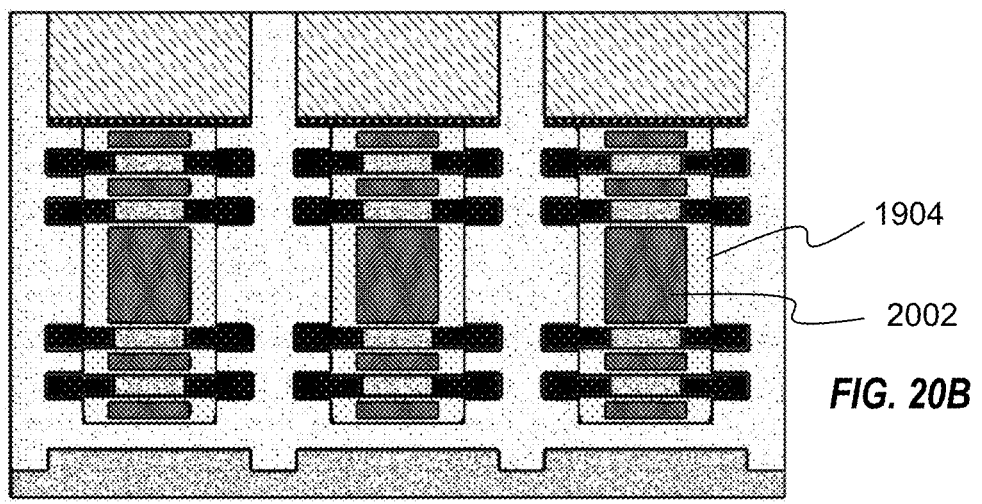
FIGS. 20B and 20C are sectional views and 20D is a perspective view of the intermediate structure in accordance with an example embodiment of the disclosed invention.
Figure 20C:
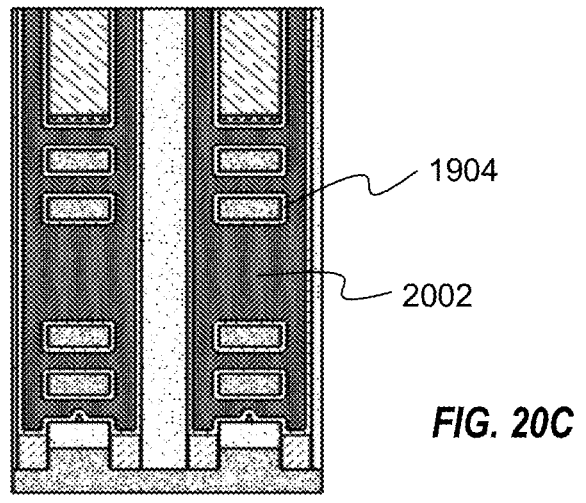
Figure 20D:
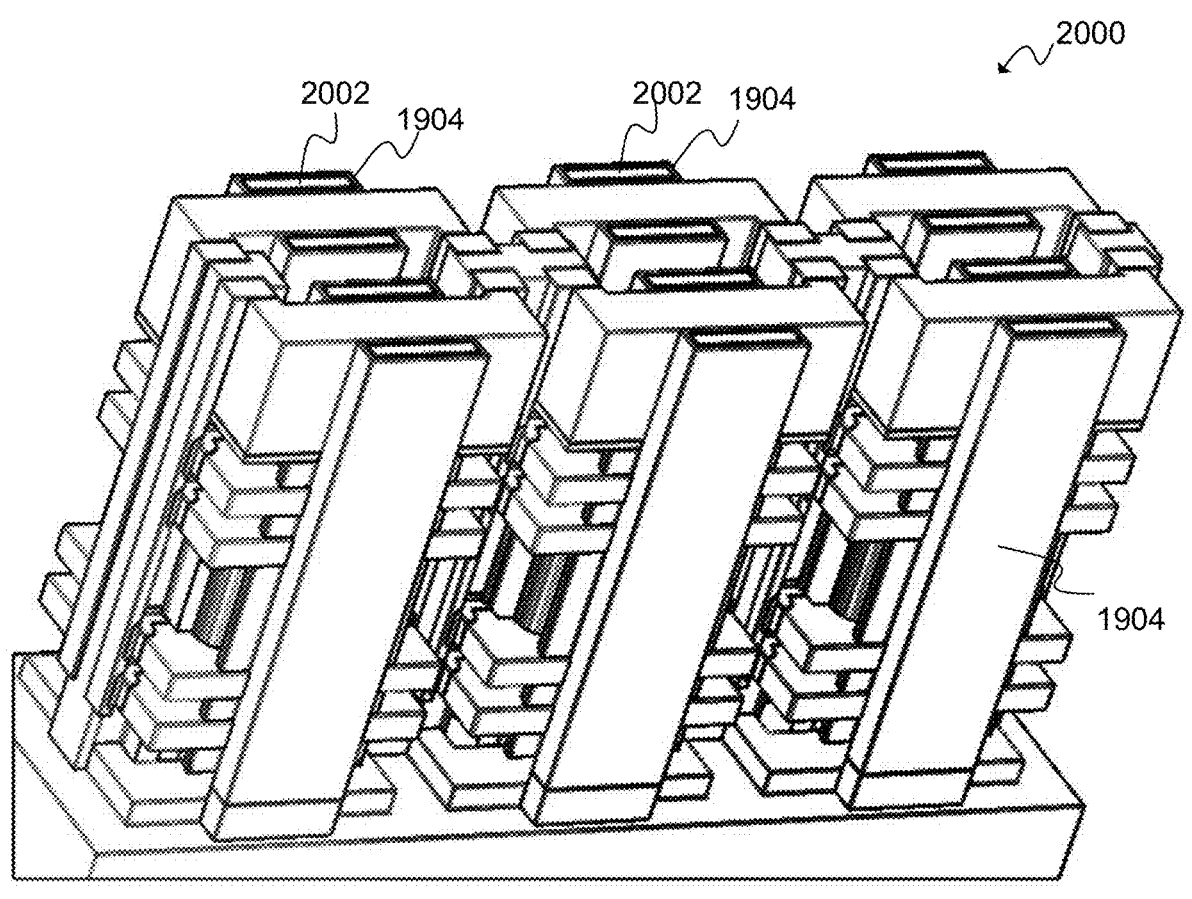

FIGS. 18A, 18B and 18C show a structure 1800 after wet etch dielectric-5 to form opening 1802 for depositing high-k material. This self-aligned gate connection opens the nanosheet for gate-all-around. At the bottom 1804, there is enough room to stop the etch to keep isolation from substrate 10. FIGS. 19A, 19B and 19C show a structure 1900 after depositing high-k material 1904 by atomic layer deposition (ALD) for example. Openings 1902 remain for gate metal fill. In FIG. 19A, high-k material 1904 appears to be shaded darker than the high-k material 1904 within openings 1902. FIGS. 20A, 20B and 20C show a structure 2000 after depositing a fill metal-2 to form gate metal 2002 and CMP. FIG. 20D shows a perspective view of the structure 2000 without material patterns for clarity of structure boundaries.

FIGS. 1-20 illustrate an example configuration in which the channel tail portions are aligned such that transistors are formed with S-D contacts facing each other. However, transistor rearrangement may provide for more compact design, such as by staggering the tail portions of the transistors. The rearrangement requires different mask patterns from those shown in FIGS. 1-20, but the process flows are quite similar.

Figures 21A, 21B, 21C:
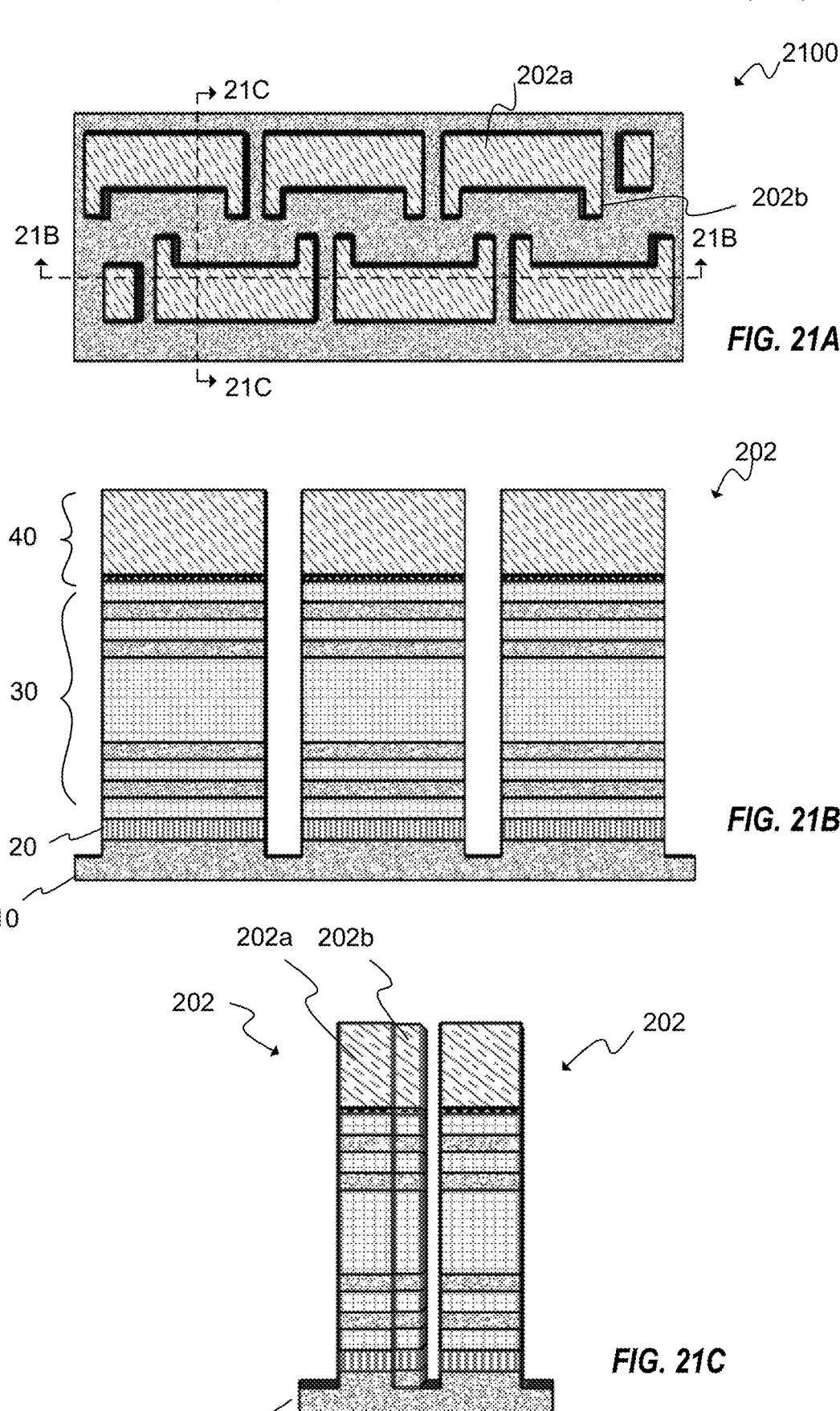
FIG. 21A is a top plane view of an intermediate structure in a process for manufacturing a complex channel transistor.
FIGS. 21B and 21C are sectional views of the intermediate structure in accordance with an example embodiment of the disclosed invention.
Figures 22A, 22B, 22C:
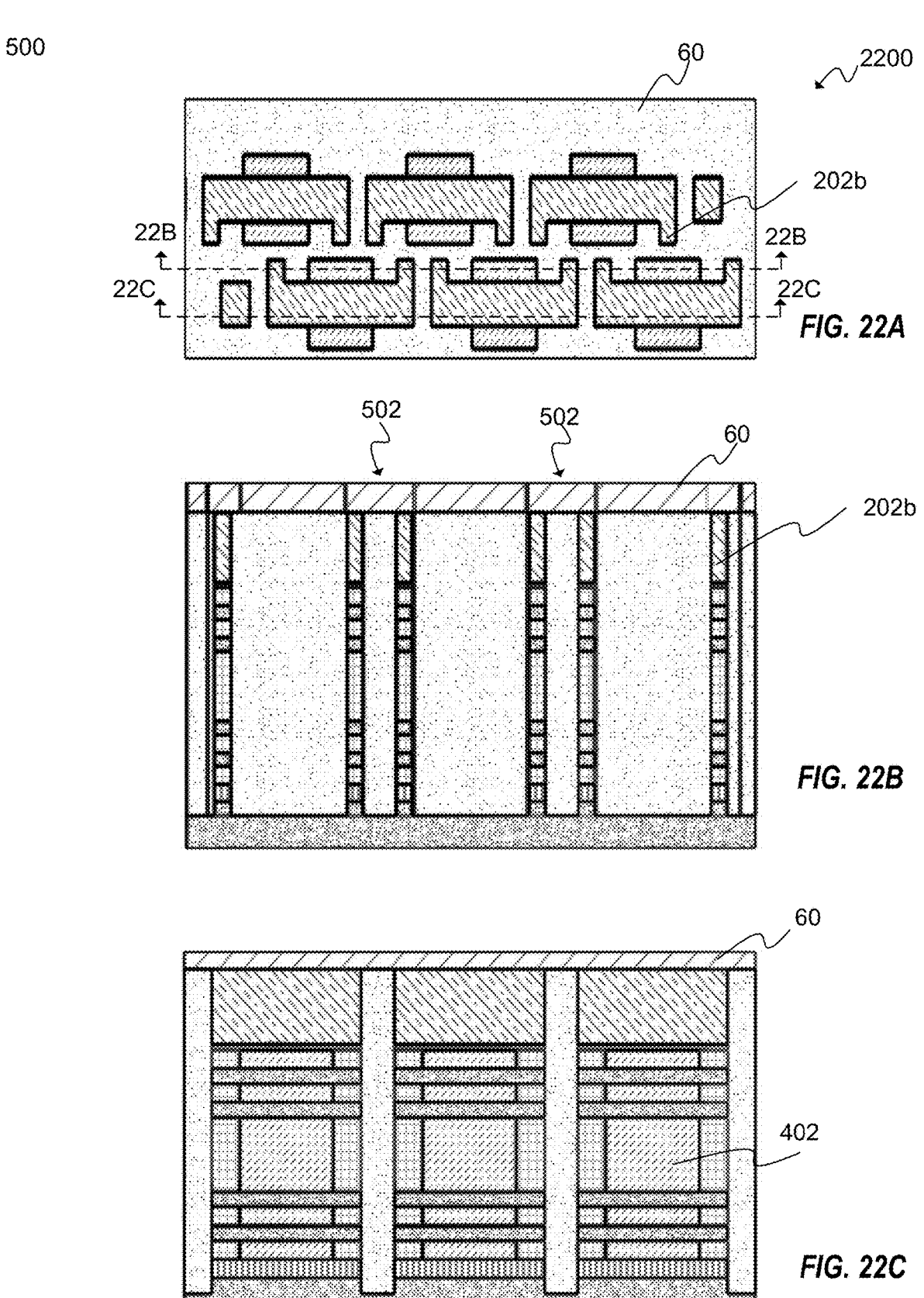
FIG. 22A is a top plane view of an intermediate structure in a process for manufacturing a complex channel transistor.
FIGS. 22B and 22C are sectional views and 22D is a perspective view of the intermediate structure in accordance with an example embodiment of the disclosed invention.
Figure 22D:
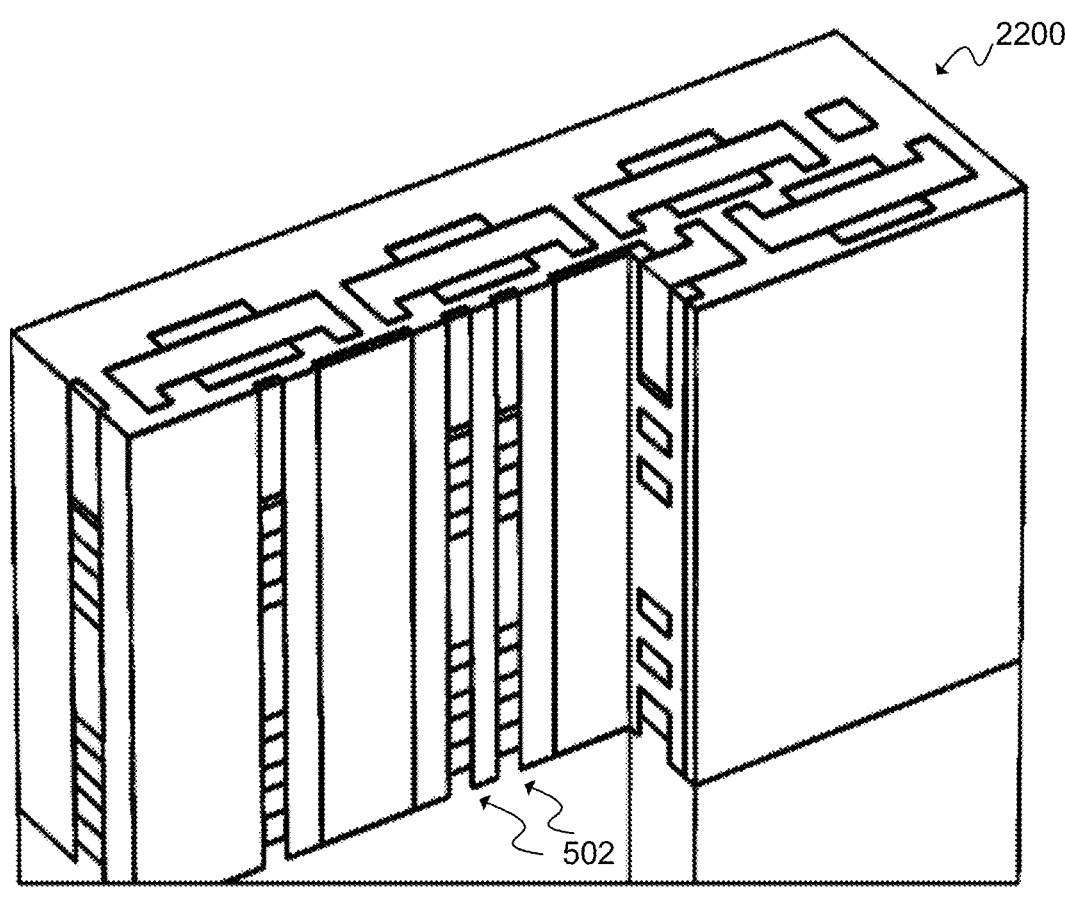
Figures 23A, 23B, 23C:
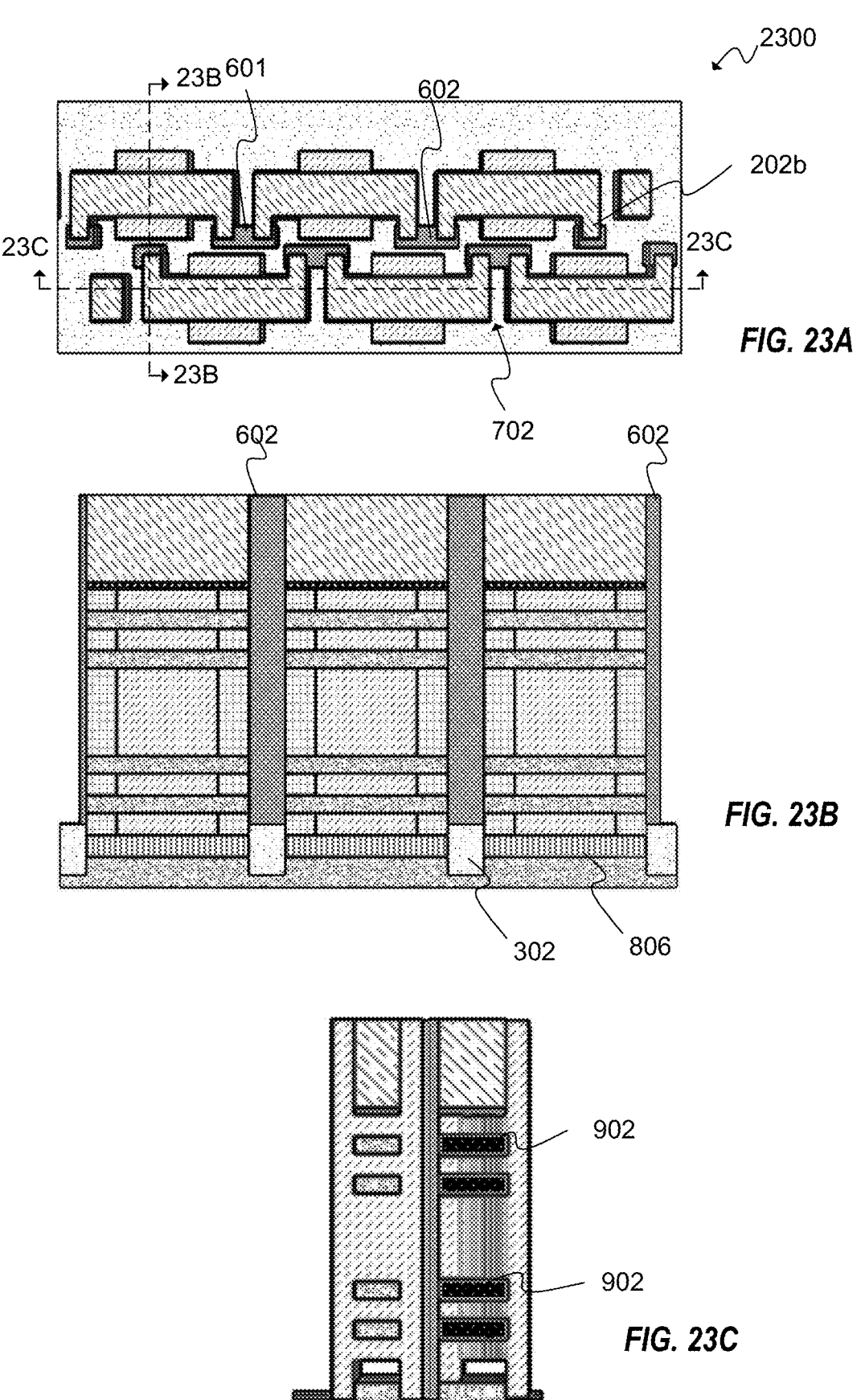
FIG. 23A is a top plane view of an intermediate structure in a process for manufacturing a complex channel transistor.
FIGS. 23B and 23C are sectional views and 23D is a perspective view of the intermediate structure in accordance with an example embodiment of the disclosed invention.
Figure 23D:
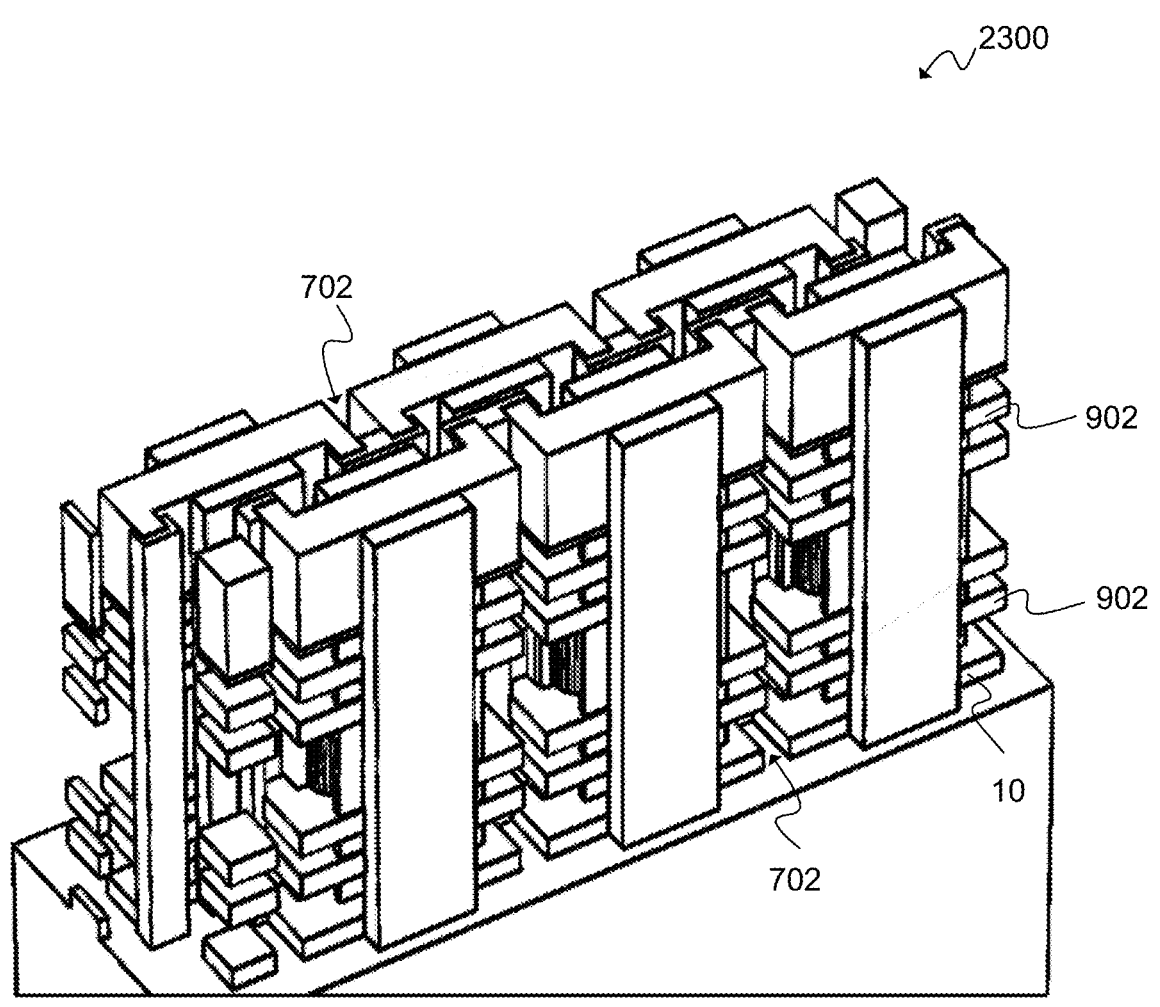
Figure 24D:
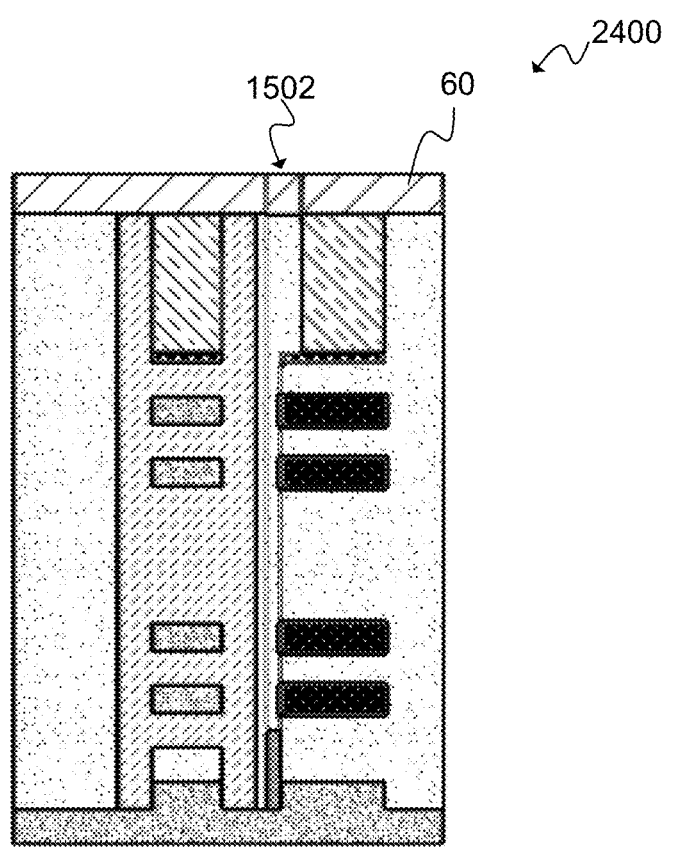
Figure 25A:
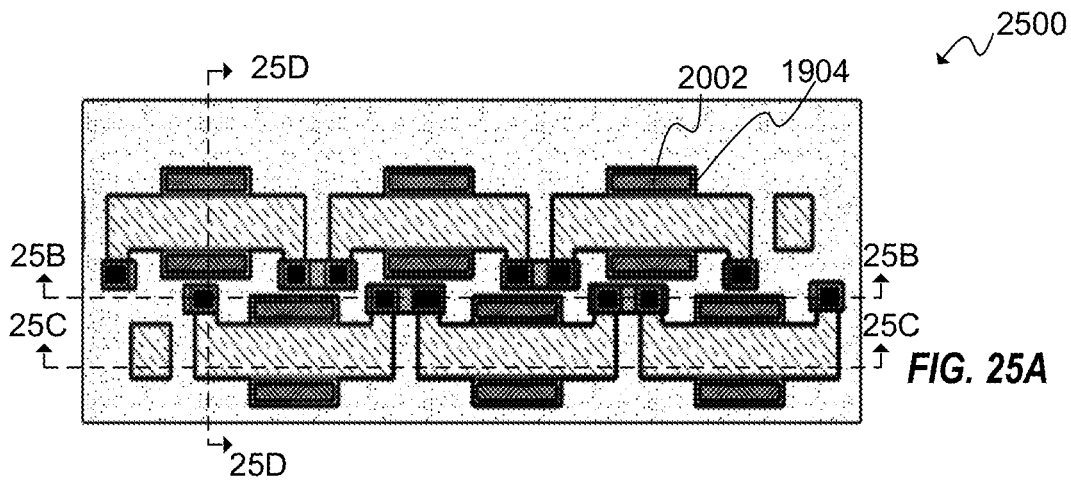
FIG. 25A is a top plane view of an intermediate structure in a process for manufacturing a complex channel transistor.
Figure 25B:
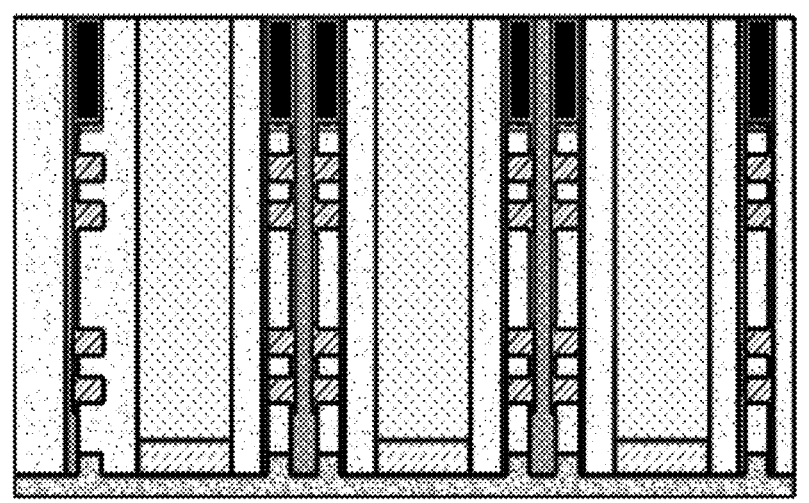
FIGS. 25B, 25C and 25D are sectional views and 25E is a perspective view of the intermediate structure in accordance with an example embodiment of the disclosed invention.
Figure 25C:
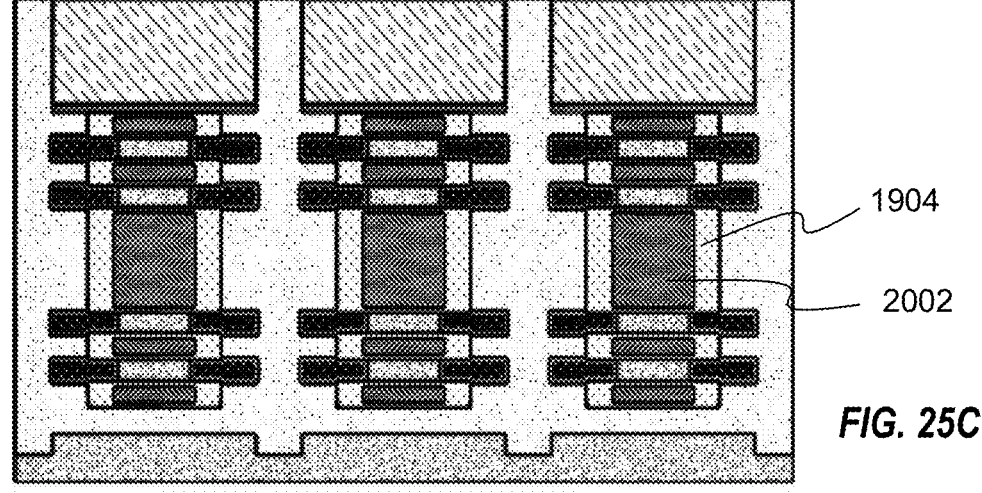
Figure 25D:
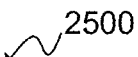
Figure 25D:
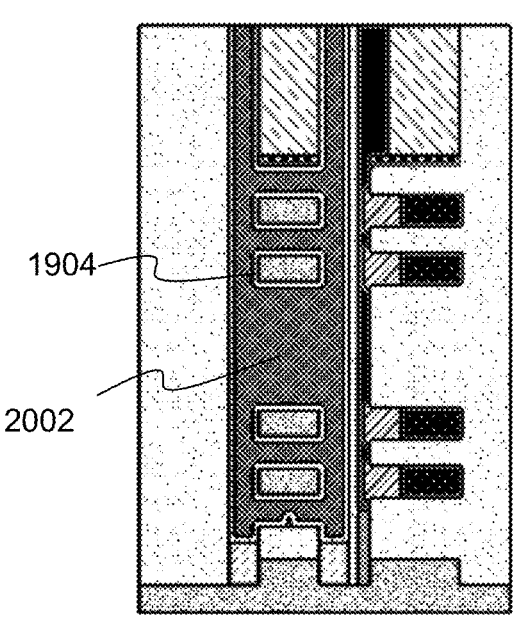
Figure 25E:
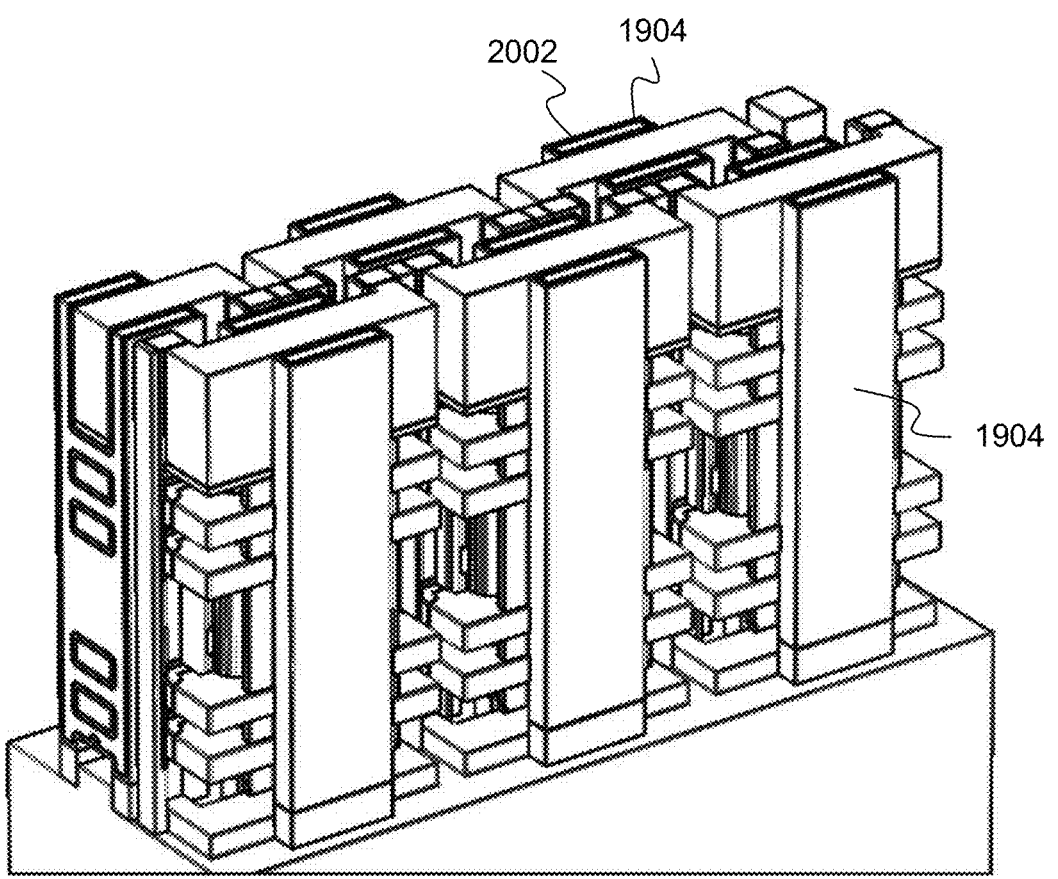

FIGS. 21A, 21B and 21C show a structure 2100 similar to FIG. 2 except with the design of the mask providing staggered tail portions 202b of the channel structure. FIGS. 22A, 22B and 22C show a structure 2200 similar to FIG. 5 with the staggered tail portions 202b. FIGS. 23A, 23B and 23C show a structure 2300 similar to FIG. 9 with the staggered tail portions 202b. FIGS. 24A, 24B and 24C show a structure 2400 similar to FIG. 15 with the staggered tail portions. FIGS. 25A, 25B and 25C show a structure 2500 similar to FIG. 20 with the staggered tail portions.

Another configuration provides a continuous nanosheet design rather than a predefined nanosheet, and isolation steps at later stage. This configuration requires different mask patterns from those shown in FIGS. 1-20, but the process flows are quite similar.

Figure 26A:
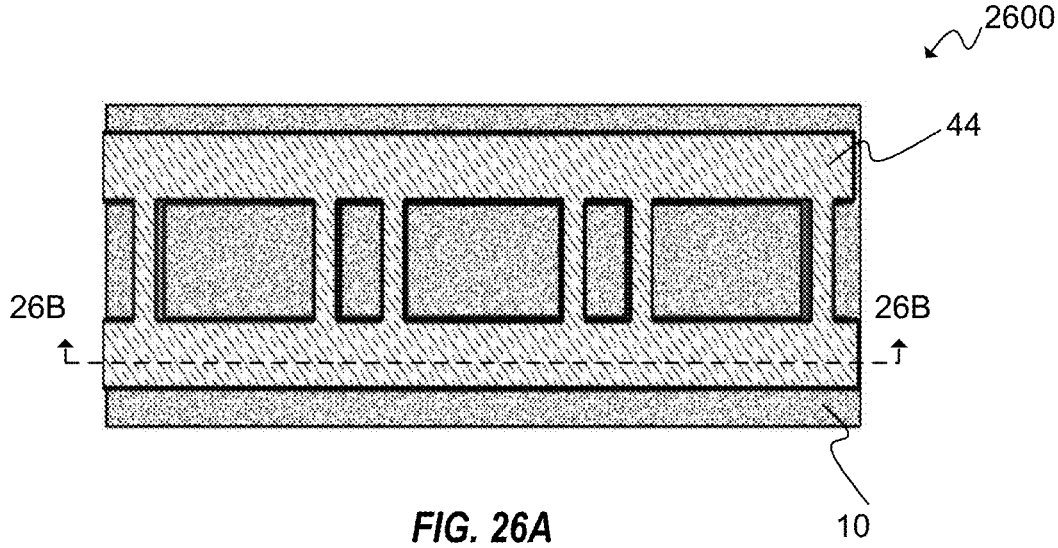
FIG. 26A is a top plane view of an intermediate structure in a process for manufacturing a complex channel transistor.
Figure 26B:
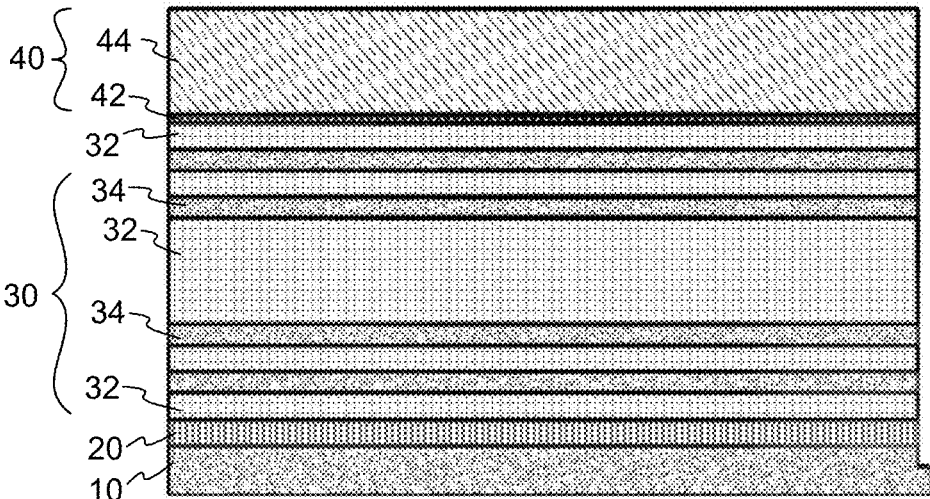
FIG. 26B is a sectional view of the intermediate structure in accordance with an example embodiment of the disclosed invention.
Figure 27A:
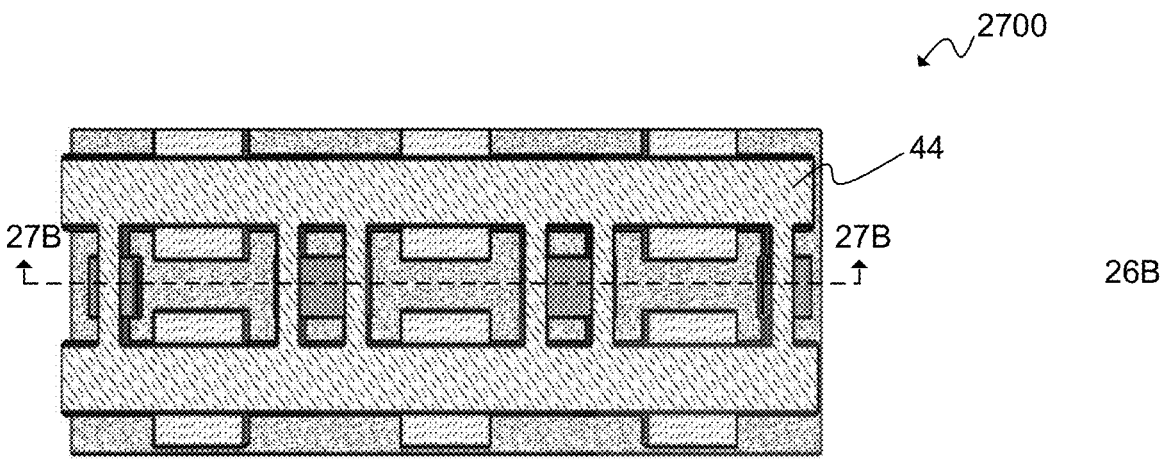
FIG. 27A is a top plane view of an intermediate structure in a process for manufacturing a complex channel transistor.
Figure 27B:
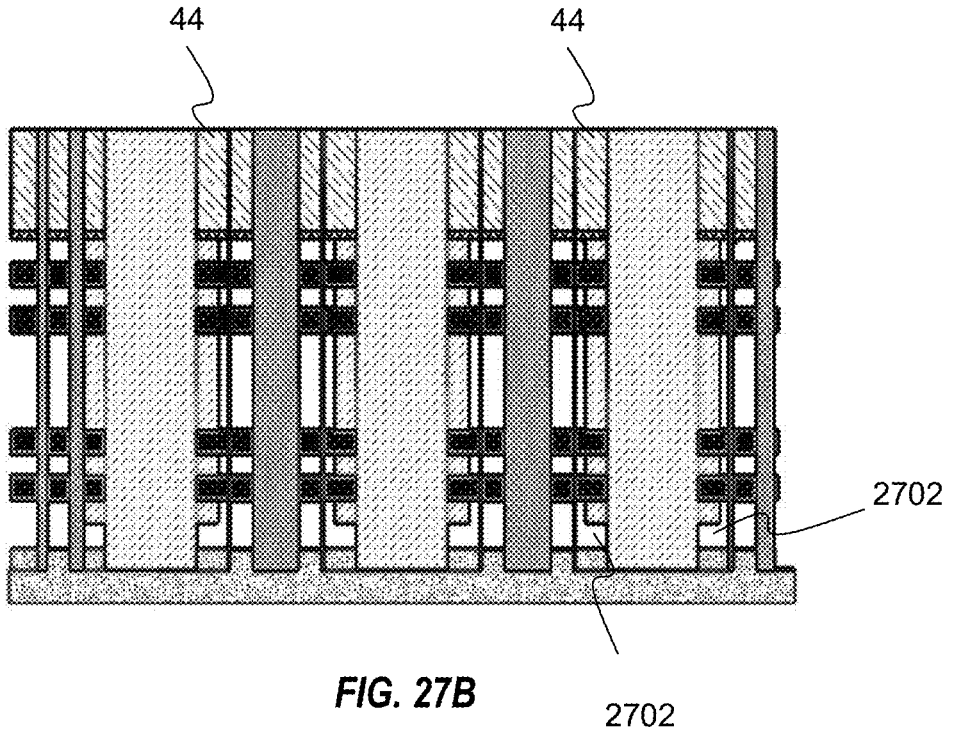
FIG. 27B is a sectional view of the intermediate structure in accordance with an example embodiment of the disclosed invention.
Figure 28A:
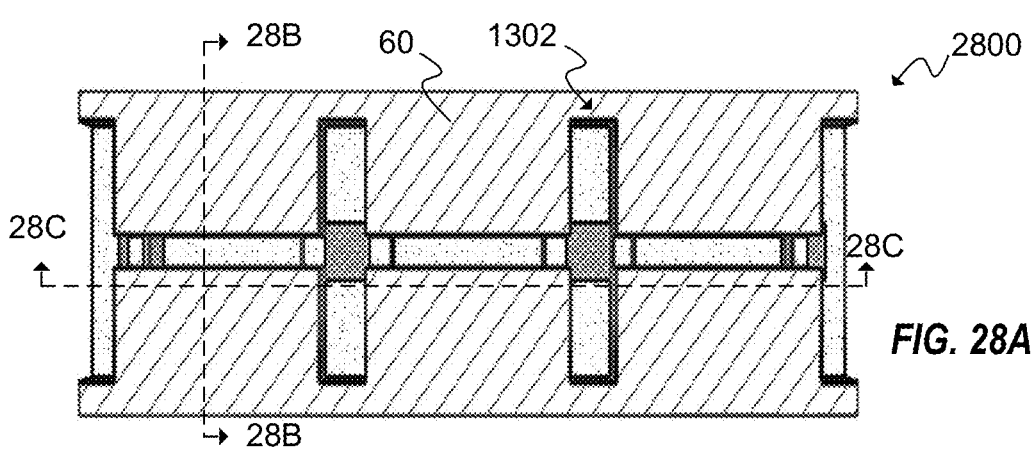
FIG. 28A is a top plane view of an intermediate structure in a process for manufacturing a complex channel transistor.
Figure 28B:
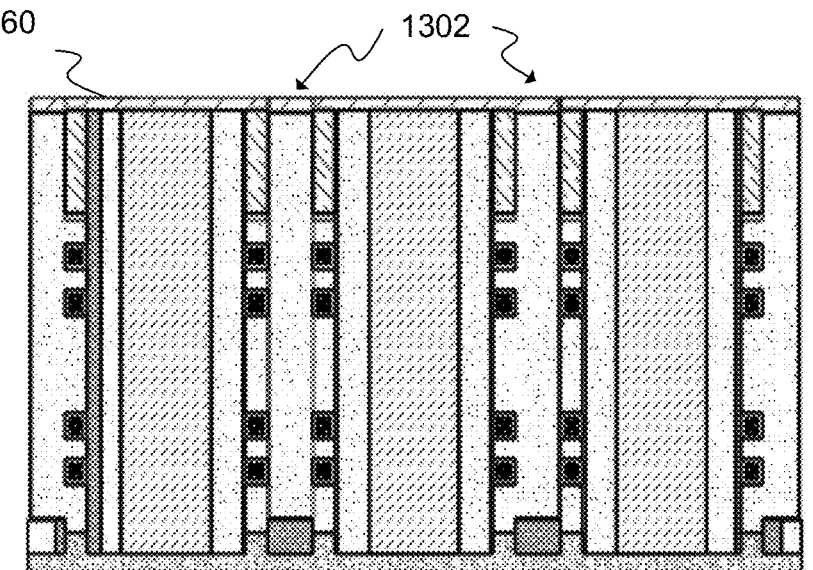
FIGS. 28B and 28C are sectional views of the intermediate structure in accordance with an example embodiment of the disclosed invention.
Figure 28C:
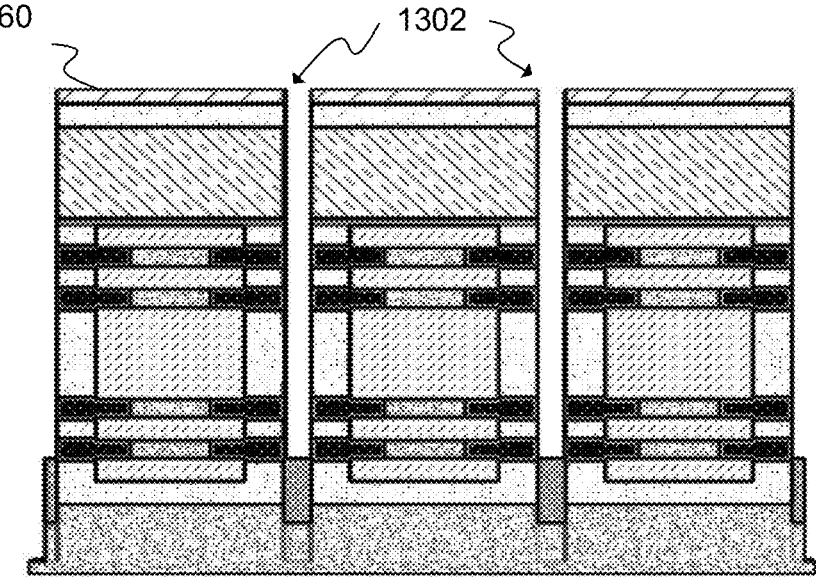
Figure 29A:
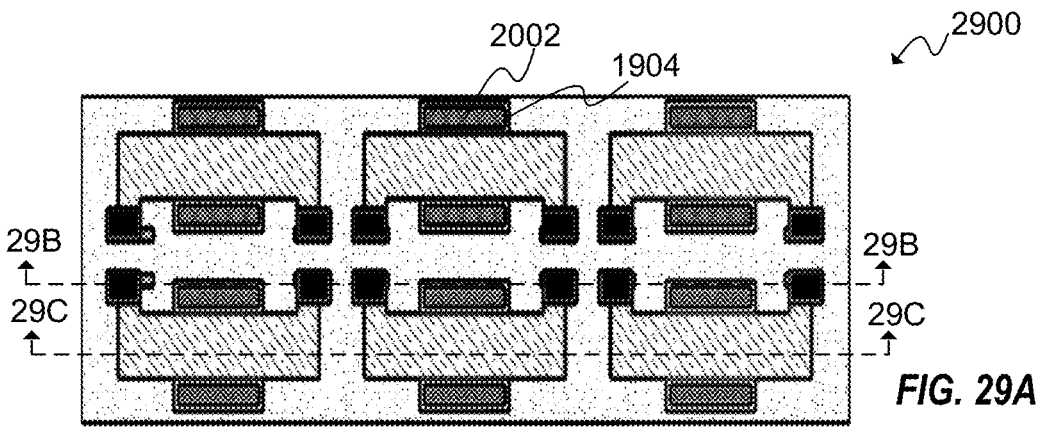
FIG. 29A is a top plane view of an intermediate structure in a process for manufacturing a complex channel transistor.
Figure 29B:
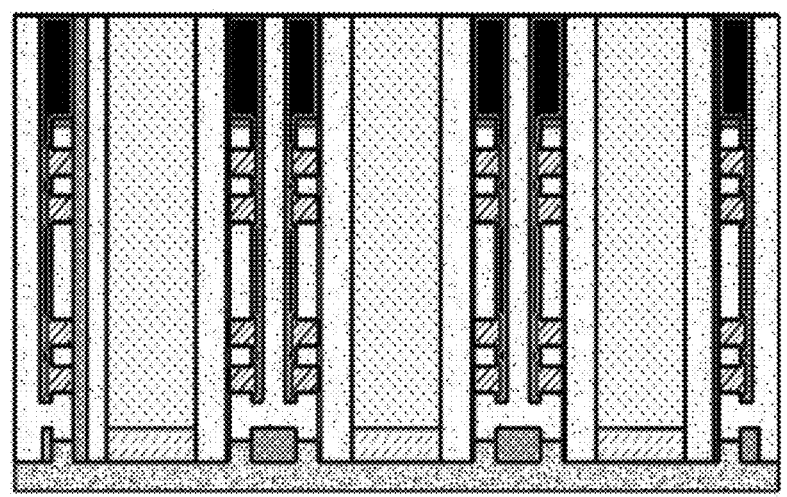
FIGS. 29B and 29C are sectional views of the intermediate structure in accordance with an example embodiment of the disclosed invention.
Figure 29C:
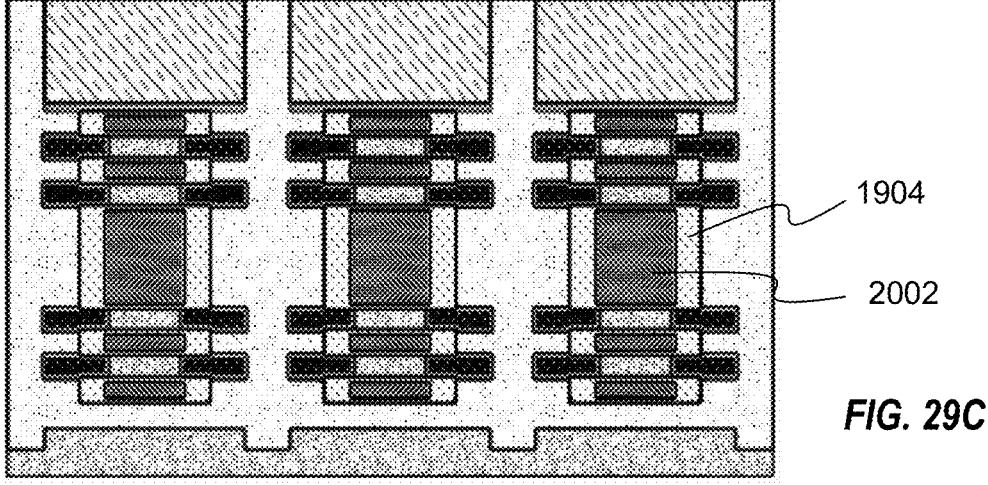

FIGS. 26A and 26B show a structure 2600 similar to FIG. 2 except with the design of the mask providing a continuous nanosheet. FIGS. 27A and 27B show a structure 2700 similar to FIG. 10 with the continuous nanosheet. FIGS. 28A, 28B and 28C show a structure 2800 similar to FIG. 13 with the continuous nanosheet. FIGS. 29A, 29B and 29C show a structure 2900 similar to FIG. 20 with the continuous nanosheet.

Techniques disclosed herein include methods and designs for a complex shaped channel structure transistor, for example with a main portion and tail portions. Any deposited channel can be used including conductive oxide (semiconductive oxide), 2D material, and large grain semiconductors. The electron or hole flow in the channel, flows from one source-drain (S-D) end, through a first tail portion into the main portion of the channel, into the second tail portion and to a second S-D end.

The semiconductor layers may be made from semiconductor materials such as Si, Ge, SiGe, GaAs, InAs, InP, semiconductive behaving oxide (e.g. $In_2O_3$, $SnO_2$, InGaZnO, and ZnO, SnO), 2D material (e.g. $WS_2$, $WSe_2$, $Wte_2$, $MoS_2$, $MoSe_2$, $MoTe_2$, $HfS_2$, $ZrS_2$, $TiS_2$, GaSe, InSe, phosphorene, $HfSe_2$, $ZrSe_2$, $HfZrSe_2$, etc.) or any other suitable semiconductor material in monocrystalline and/or polycrystalline form. Further, the S-D regions may be doped with either p-type or n-type dopants at various doping concentration levels. The p-type dopant may be boron and the n-type dopant may be phosphorus or arsenic, however other suitable dopant materials may be used. Various techniques may be used to provide a strained channel material to improve carrier mobility, for example.

The doped S-D regions may also be made from any semiconductor material in monocrystalline or polycrystalline form and doped with either p-type or n-type dopants at various doping concentration levels. Various S-D contact engineering techniques known in the semiconductor fabrication art may be employed in the design and formation of S-D regions. For example, the S-D regions may include S-D extensions.

Insulation and dielectric layers may be implemented as a dielectric material such as SiO, SiN, SiON, SiC, SiOC, SiCN, SiOCN, the like, or a combination thereof. These structures may also be implemented as high-k dielectrics. The same or different dielectric materials can be used for these structures. Device contacts, connections vias and the like may be made of any conductive material, such as a doped polysilicon material or a metal such as W, Co, Ru, Cu, Al, the like, or combinations thereof. The same or different conductor materials can be used for these structures.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

What is claimed is:

1. A semiconductor device comprising:
   a substrate comprising a working surface; and
   a transistor formed in the substrate, the transistor comprising:
      a complex channel structure comprising a main portion extending in a main direction along the working surface, and tail portions each connected to a respective end of the main portion and extending along the working surface in a different direction from the main direction, a distal end of each tail portion including a source-drain (S-D) end such that the S-D ends are offset from the main portion of the complex channel structure,
      a gate all around (GAA) structure formed around only the main portion of the complex channel structure between the tail portions, and
      S-D contacts formed on respective S-D ends of the complex channel structure such that the S-D contacts are offset from the GAA structure.

2. The semiconductor device of claim 1, wherein each tail portion extends along a direction substantially perpendicular to the main direction.

3. The semiconductor device of claim 2, wherein the transistor comprises:
   a first S-D region comprising a first one of the tail portions connected to a first end of the main portion and terminating in a first one of the S-D ends; and
   a second S-D region comprising a second one of the tail portions connected to a second end of the main portion and terminating in a second one of the S-D ends.

4. The semiconductor device of claim 1, wherein the GAA structure comprises a high-k layer formed around the main portion and a gate metal formed around the high-k layer.

5. The semiconductor device of claim 1, wherein the S-D contacts comprise epitaxial doped silicon.

6. The semiconductor device of claim 1, wherein the S-D contacts comprise metal and silicide.

7. The semiconductor device of claim 3, wherein the complex channel structure is a U-shaped channel structure in a plane parallel to the working surface of the substrate and ends of the U-shaped channel structure provide the first and second S-D ends.

8. The semiconductor device of claim 7, comprising a plurality of said transistors each having said U-shaped channel structure and arranged adjacent to each other such that the S-D ends of a first transistor face the S-D ends of a second transistor.

9. The semiconductor device of claim 7, comprising a plurality of said transistors each having said U-shaped channel structure and arranged adjacent to each other such that the S-D ends of a first transistor are staggered with respect to the S-D ends of a second transistor.

10. The semiconductor device of claim 7, comprising a stack of transistors each having said U-shaped channel structure and arranged over each other such that the U-shaped channel structure of a lower transistor is vertically aligned with the U-shaped channel structure of an upper transistor.

\* \* \* \* \*